(12) United States Patent
Masuoka et al.

(10) Patent No.: US 8,836,051 B2
(45) Date of Patent: Sep. 16, 2014

(54) METHOD FOR PRODUCING SEMICONDUCTOR DEVICE AND SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP); Hiroki Nakamura, Tokyo (JP); Xiang Li, Singapore (SG); Xinpeng Wang, Singapore (SG); Zhixian Chen, Singapore (SG); Aashit Ramachandra Kamath, Singapore (SG); Navab Singh, Singapore (SG)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/908,125

(22) Filed: Jun. 3, 2013

(65) Prior Publication Data

US 2013/0328138 A1 Dec. 12, 2013

Related U.S. Application Data

(60) Provisional application No. 61/657,138, filed on Jun. 8, 2012.

(51) Int. Cl.

| | |
|---|---|
| H01L 29/78 | (2006.01) |
| H01L 29/786 | (2006.01) |
| H01L 29/06 | (2006.01) |
| H01L 29/66 | (2006.01) |
| H01L 29/775 | (2006.01) |
| H01L 29/423 | (2006.01) |

(52) U.S. Cl.
CPC ........ *H01L 29/785* (2013.01); *H01L 29/78642* (2013.01); *H01L 29/0676* (2013.01); *H01L 29/66795* (2013.01); *H01L 29/775* (2013.01); *H01L 29/42392* (2013.01); *H01L 29/66439* (2013.01); *H01L 29/66742* (2013.01)
USPC ........................................................ 257/413

(58) Field of Classification Search
USPC ............ 257/329, E27.06, 327, 347, 351, 368, 257/369, 393, E29.262, E21.41, 120, 133, 257/127, 146, 153, 175; 438/197, 268, 283, 438/156
See application file for complete search history.

(56) References Cited

U.S. PATENT DOCUMENTS

| | | | |
|---|---|---|---|
| 2009/0242972 A1* | 10/2009 | Cho | 257/329 |
| 2010/0320530 A1* | 12/2010 | Cheng | 257/329 |
| 2011/0062523 A1* | 3/2011 | Masuoka et al. | 257/368 |
| 2011/0303973 A1 | 12/2011 | Masuoka et al. | |
| 2013/0328138 A1* | 12/2013 | Masuoka et al. | 257/413 |

FOREIGN PATENT DOCUMENTS

| | | |
|---|---|---|
| JP | 02188966 A | 7/1990 |
| JP | 03145761 A | 6/1991 |

(Continued)

OTHER PUBLICATIONS

B.Yang, et al. "Vertical Silicon-Nanowire Formation and Gate-All-Aroung MOSFET", IEEE Electron Device Letters, vol. 29, No. 7, Jul. 2008, pp. 791-794.

*Primary Examiner* — Dao H Nguyen
*Assistant Examiner* — Tram H Nguyen
(74) *Attorney, Agent, or Firm* — Laurence A. Greenberg; Werner H. Stemer; Ralph E. Locher

(57) ABSTRACT

A method for producing a semiconductor device includes a first step including forming a planar silicon layer and forming first and second pillar-shaped silicon layers; a second step including forming a gate insulating film around each of the first and second pillar-shaped silicon layers, forming a metal film and a polysilicon film around the gate insulating film, the thickness of the polysilicon film being smaller than half of a distance between the first and second pillar-shaped silicon layers, forming a third resist, and forming a gate line; and a third step including depositing a fourth resist so that a portion of the polysilicon film on an upper side wall of each of the first and second pillar-shaped silicon layers is exposed, removing the exposed portion of the polysilicon film, removing the fourth resist, and removing the metal film to form first and second gate electrodes.

11 Claims, 40 Drawing Sheets

(56) References Cited

FOREIGN PATENT DOCUMENTS

| JP | 071556 A | 1/1995 |
| JP | 2009182317 A | 8/2009 |
| JP | 2010272874 A | 12/2010 |
| JP | 2012004244 A | 1/2012 |

* cited by examiner

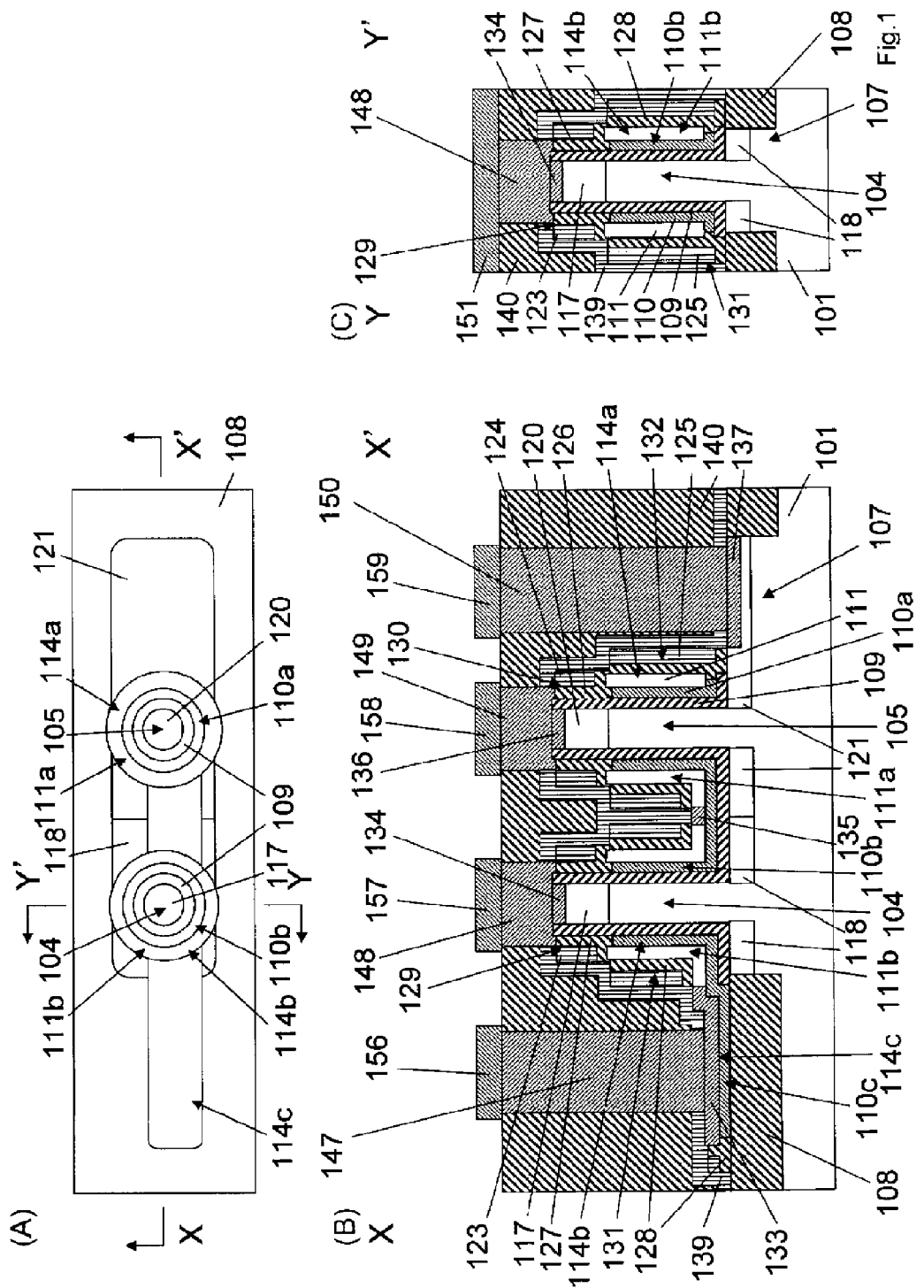

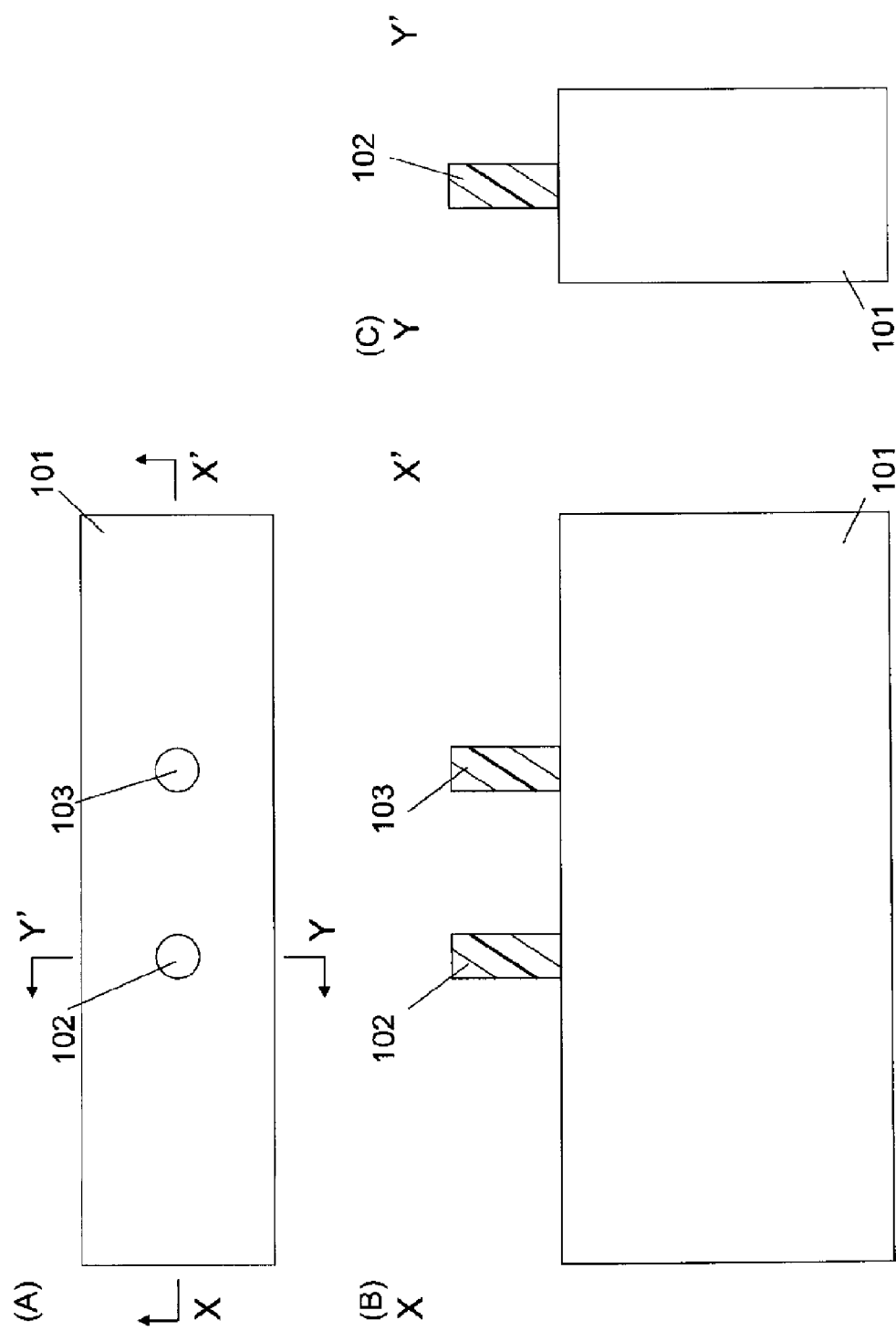

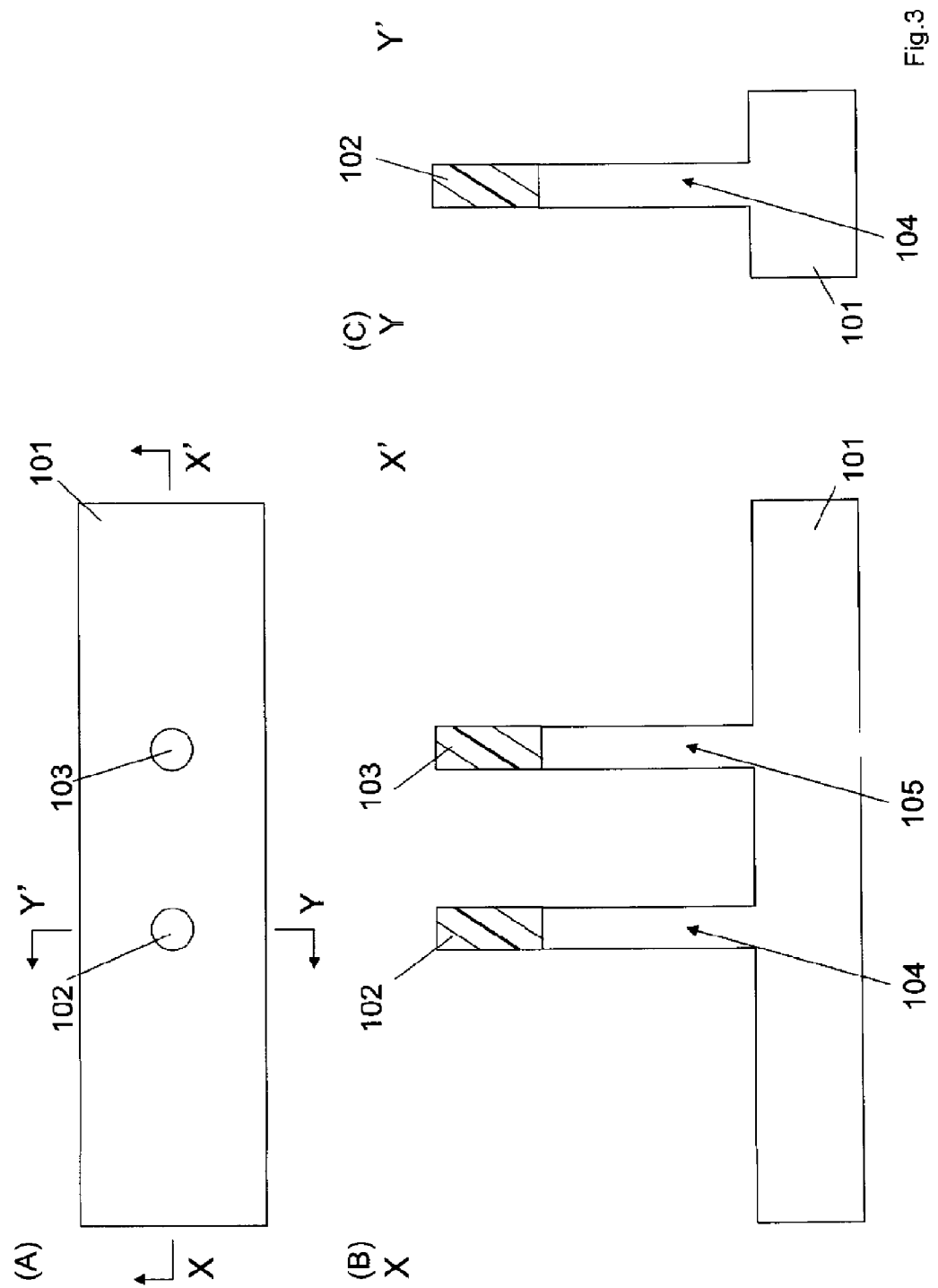

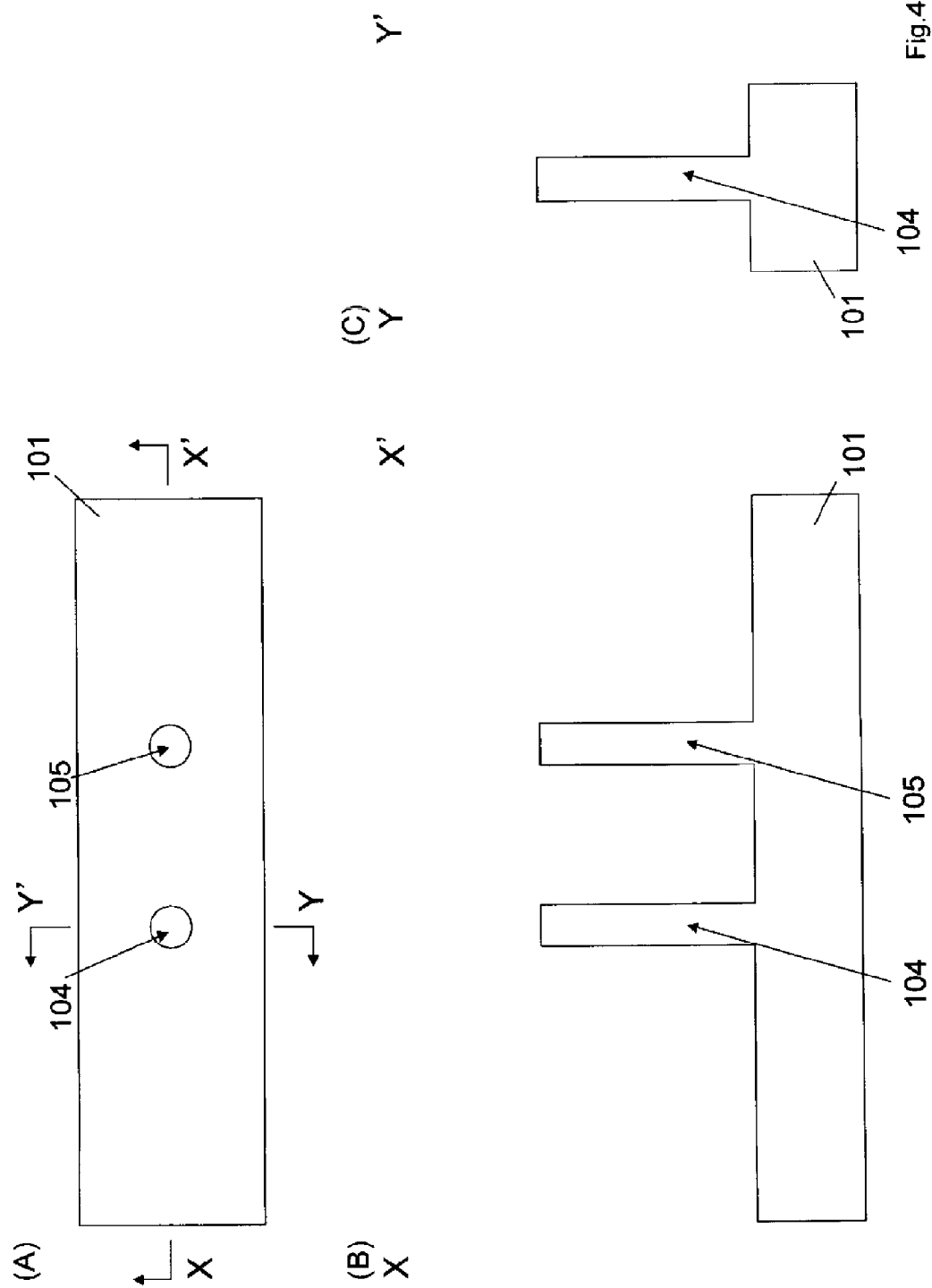

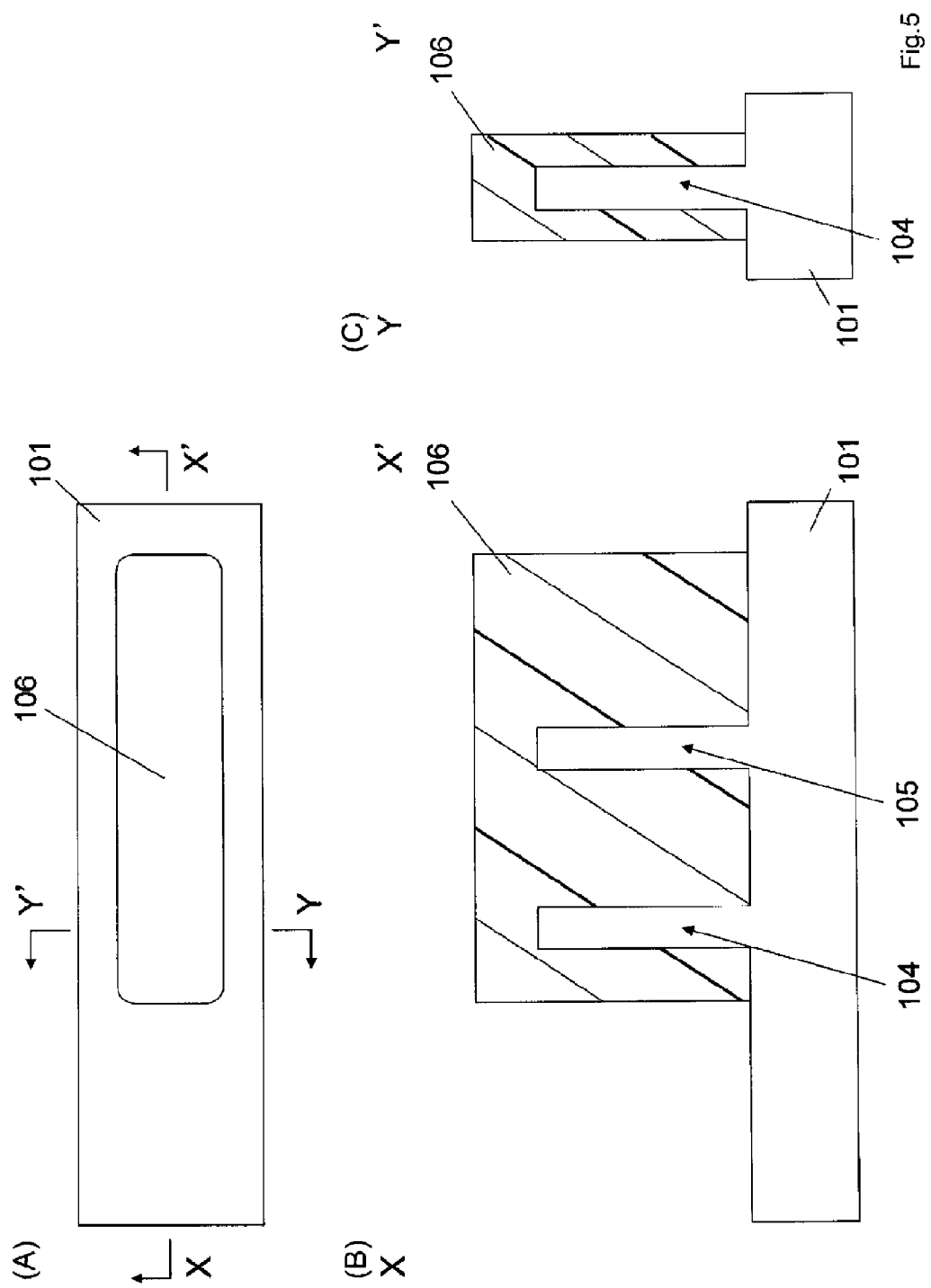

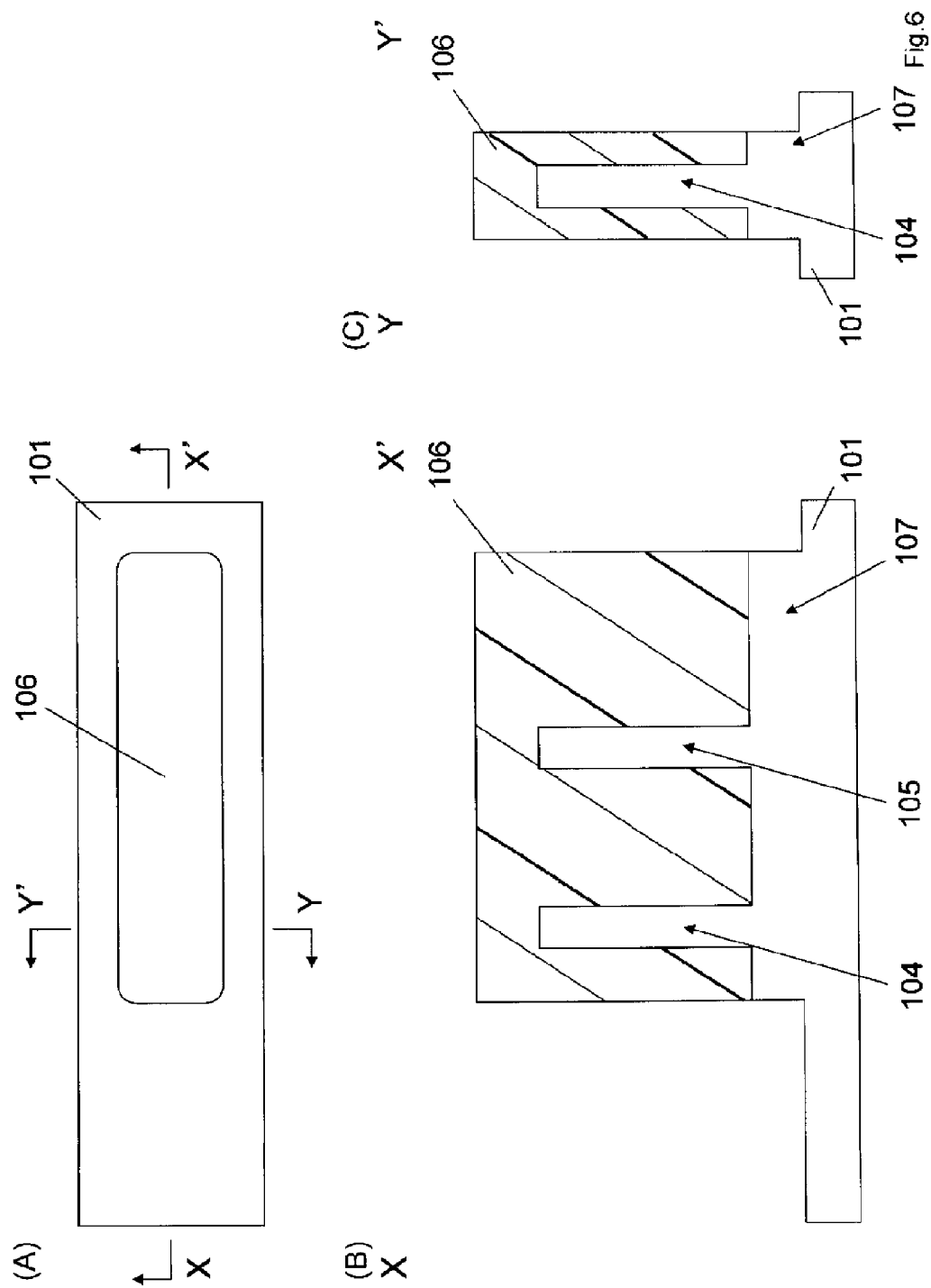

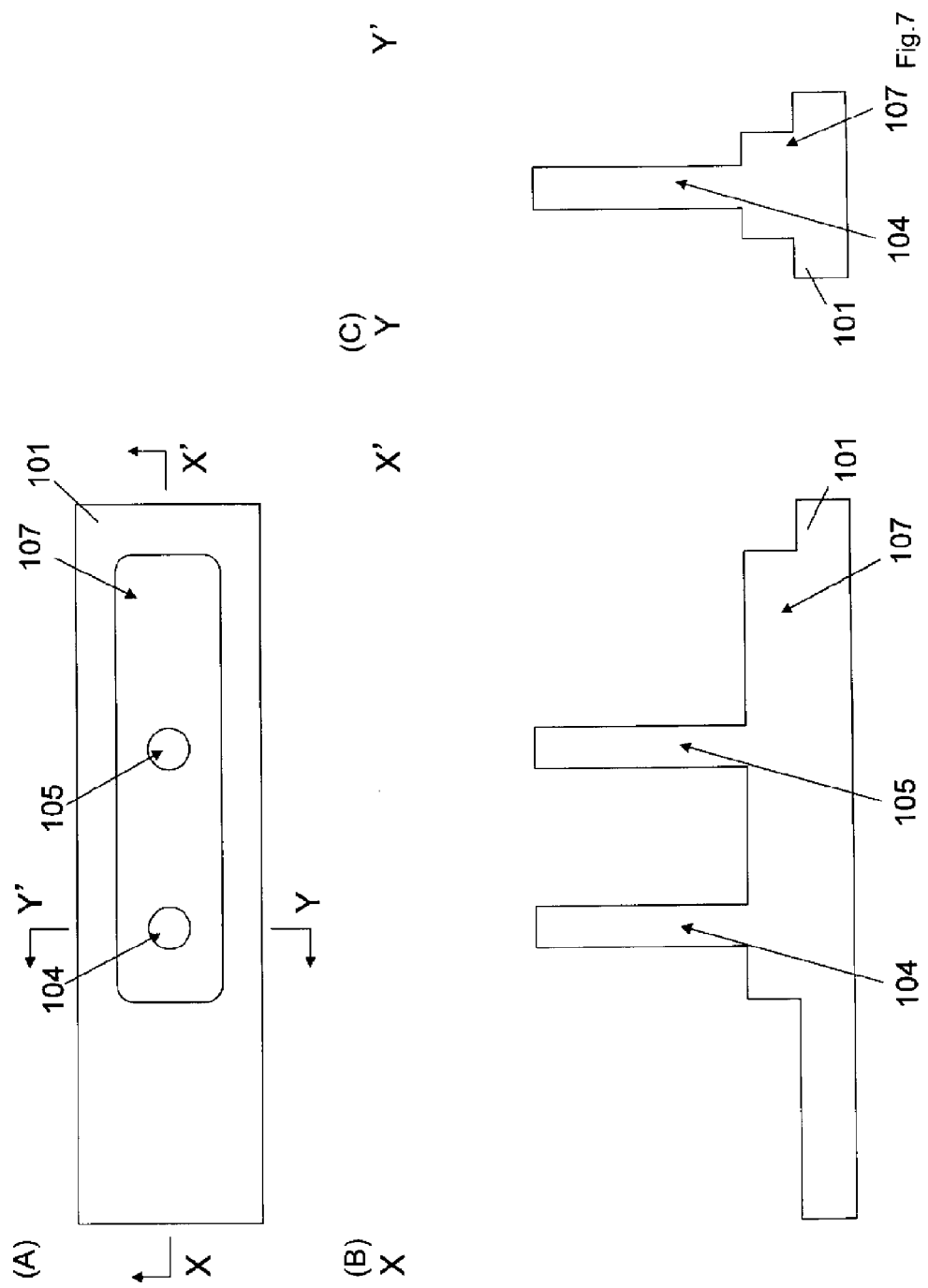

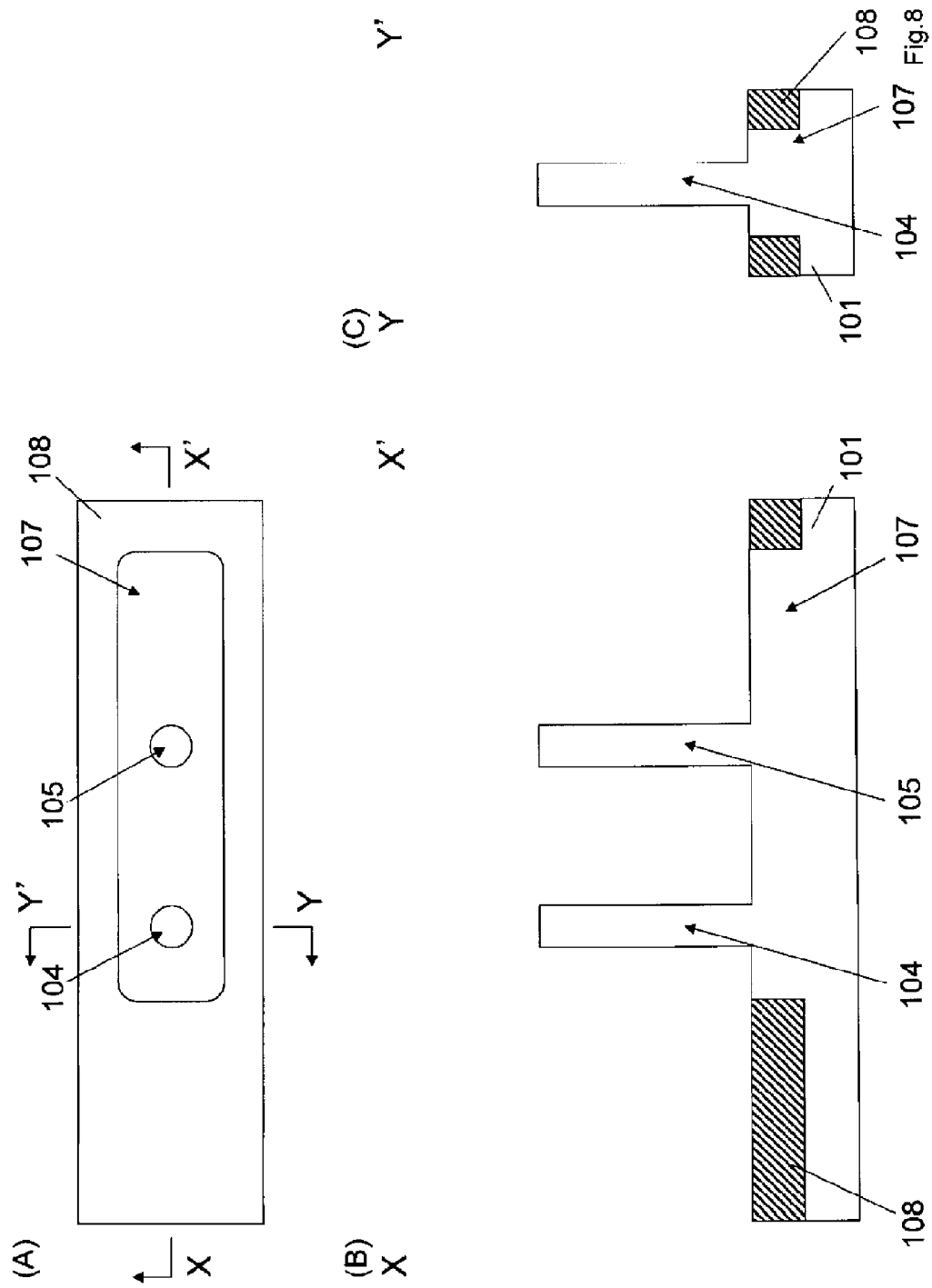

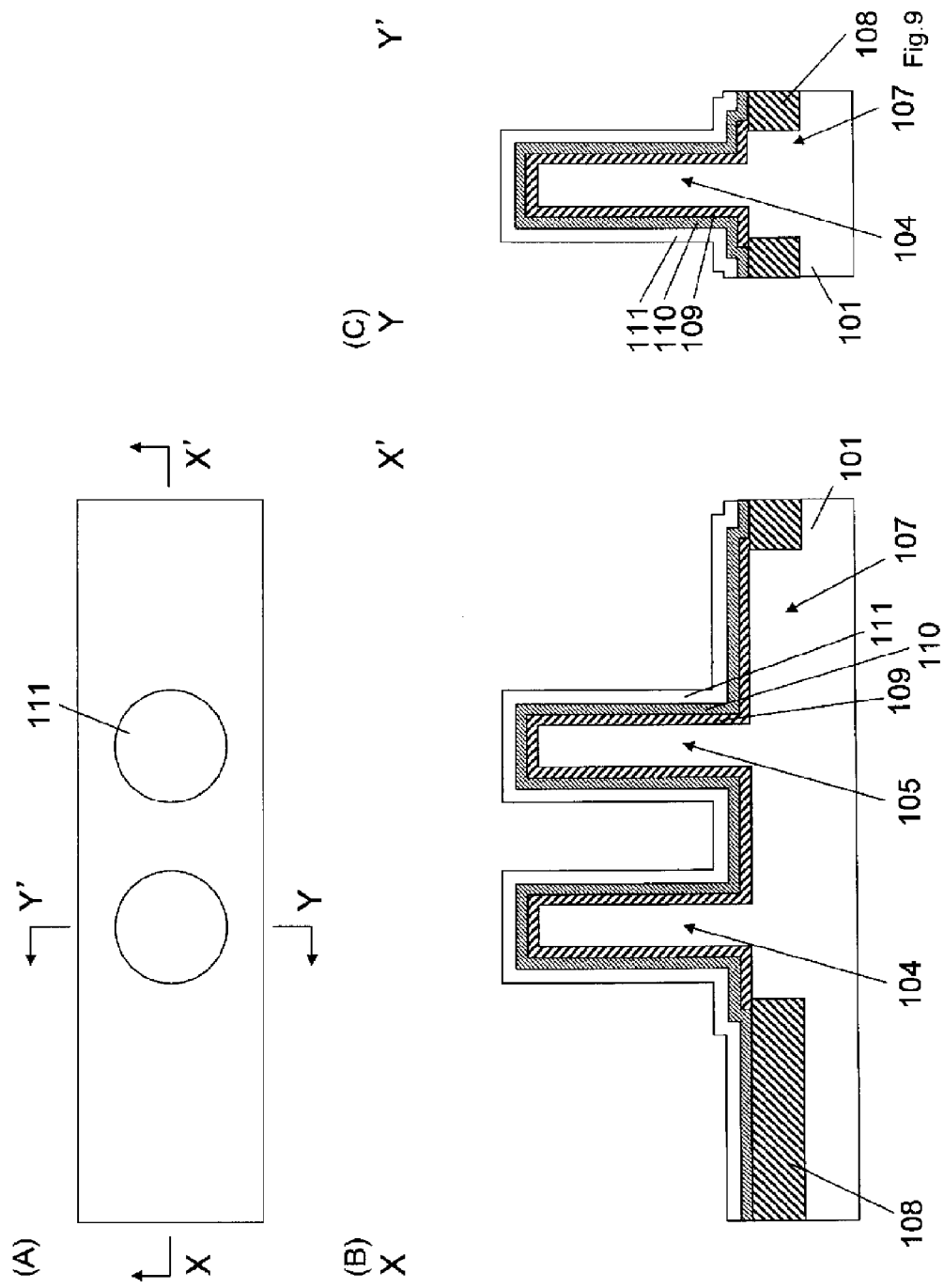

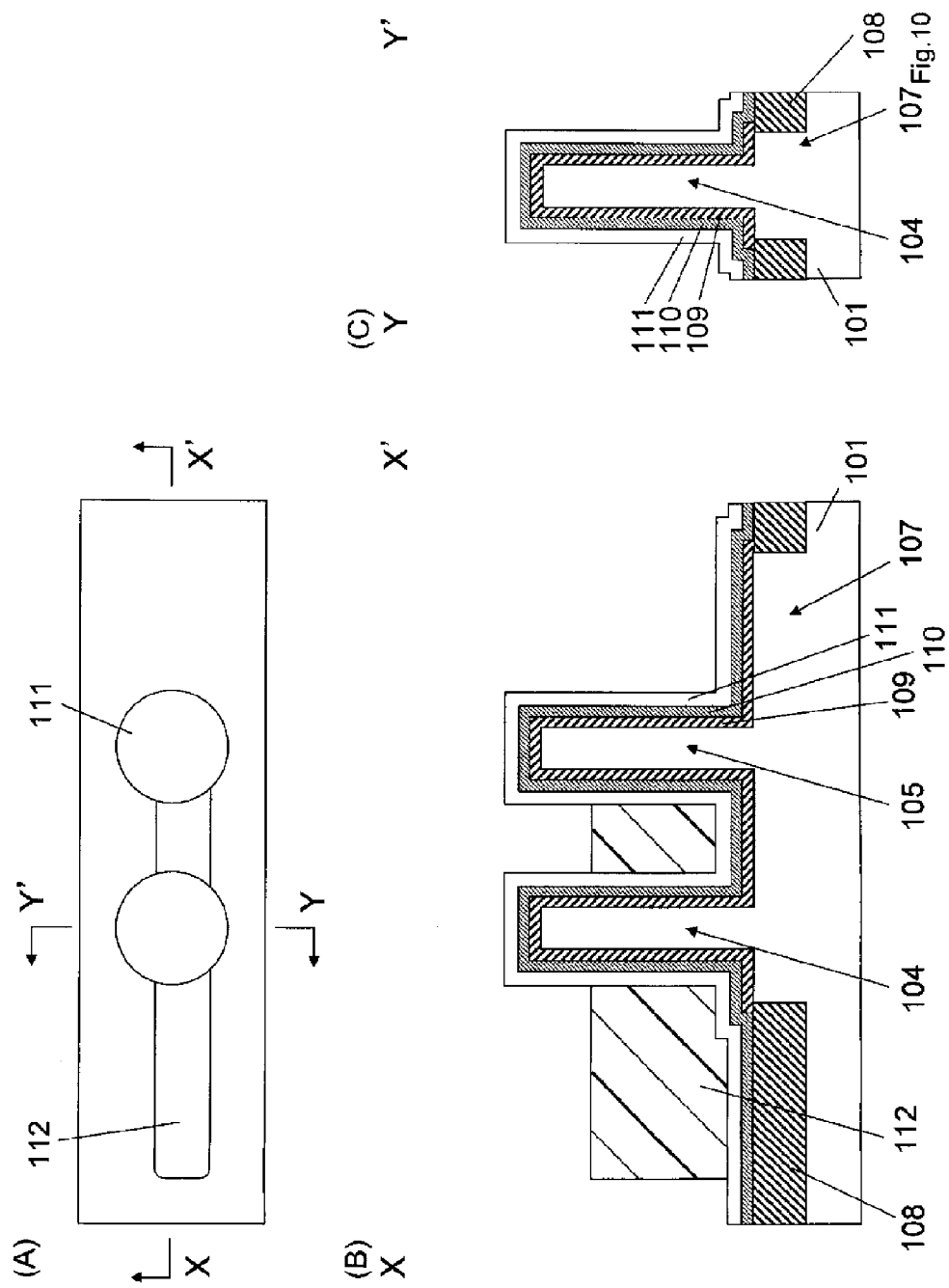

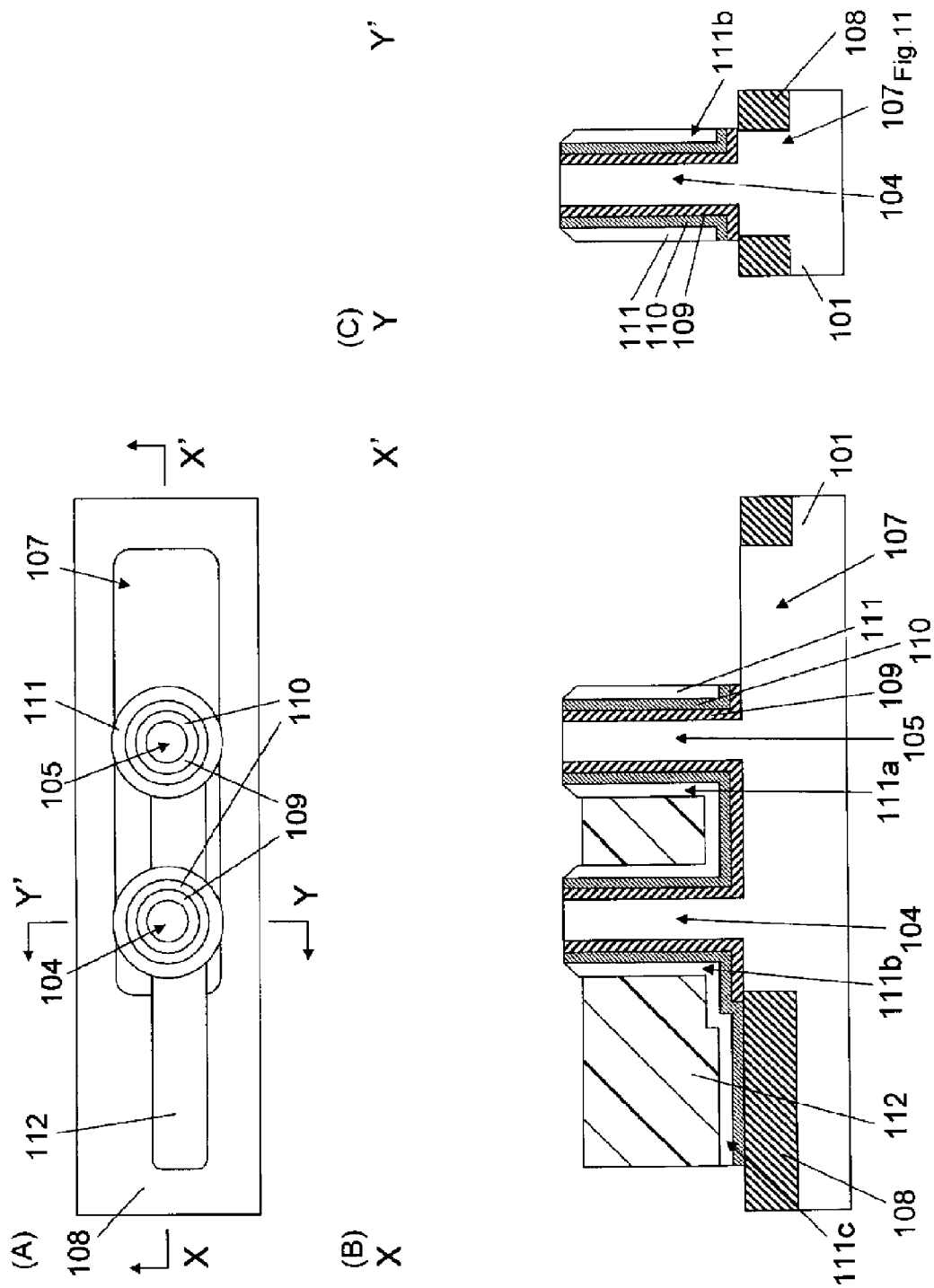

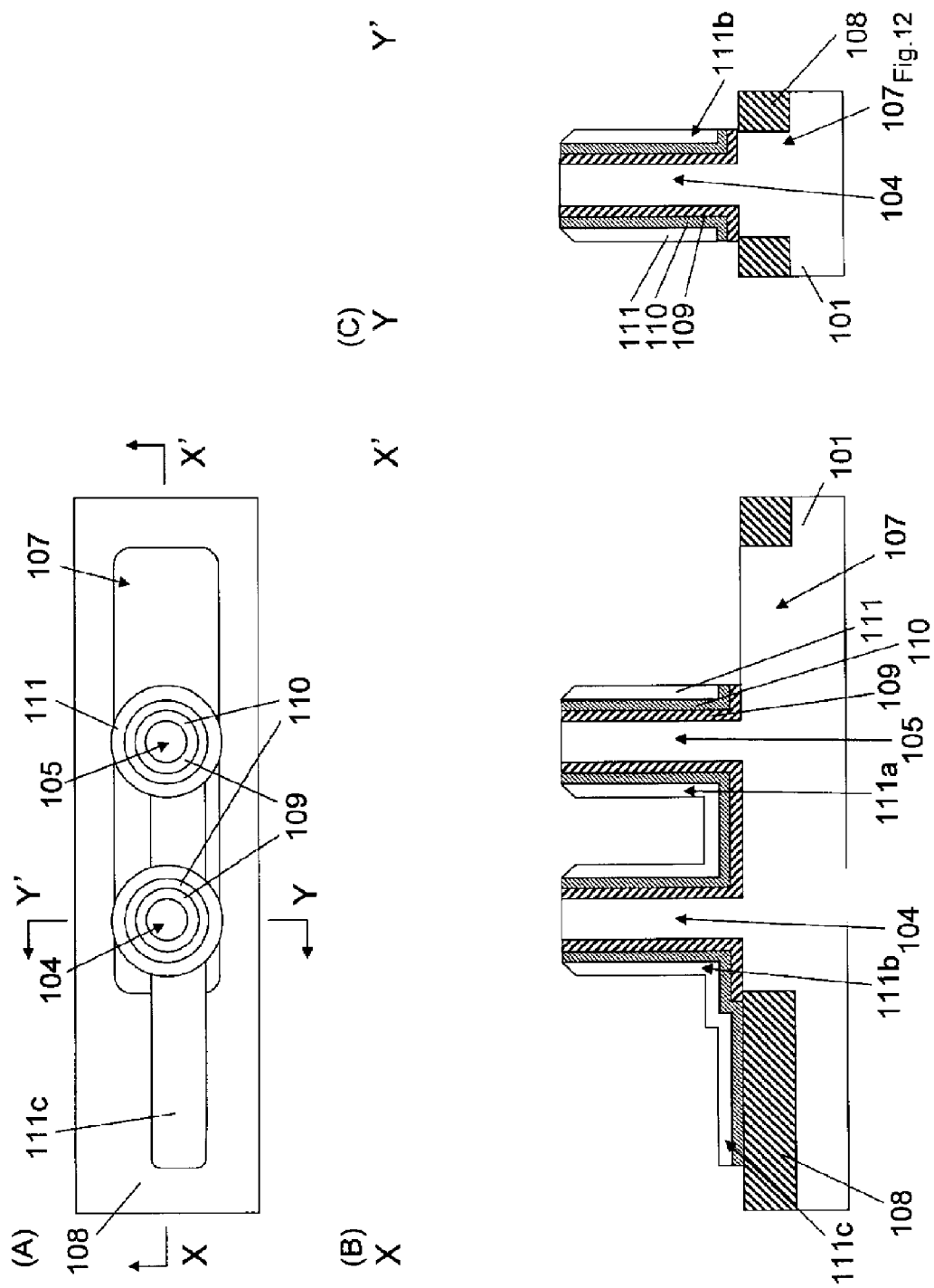

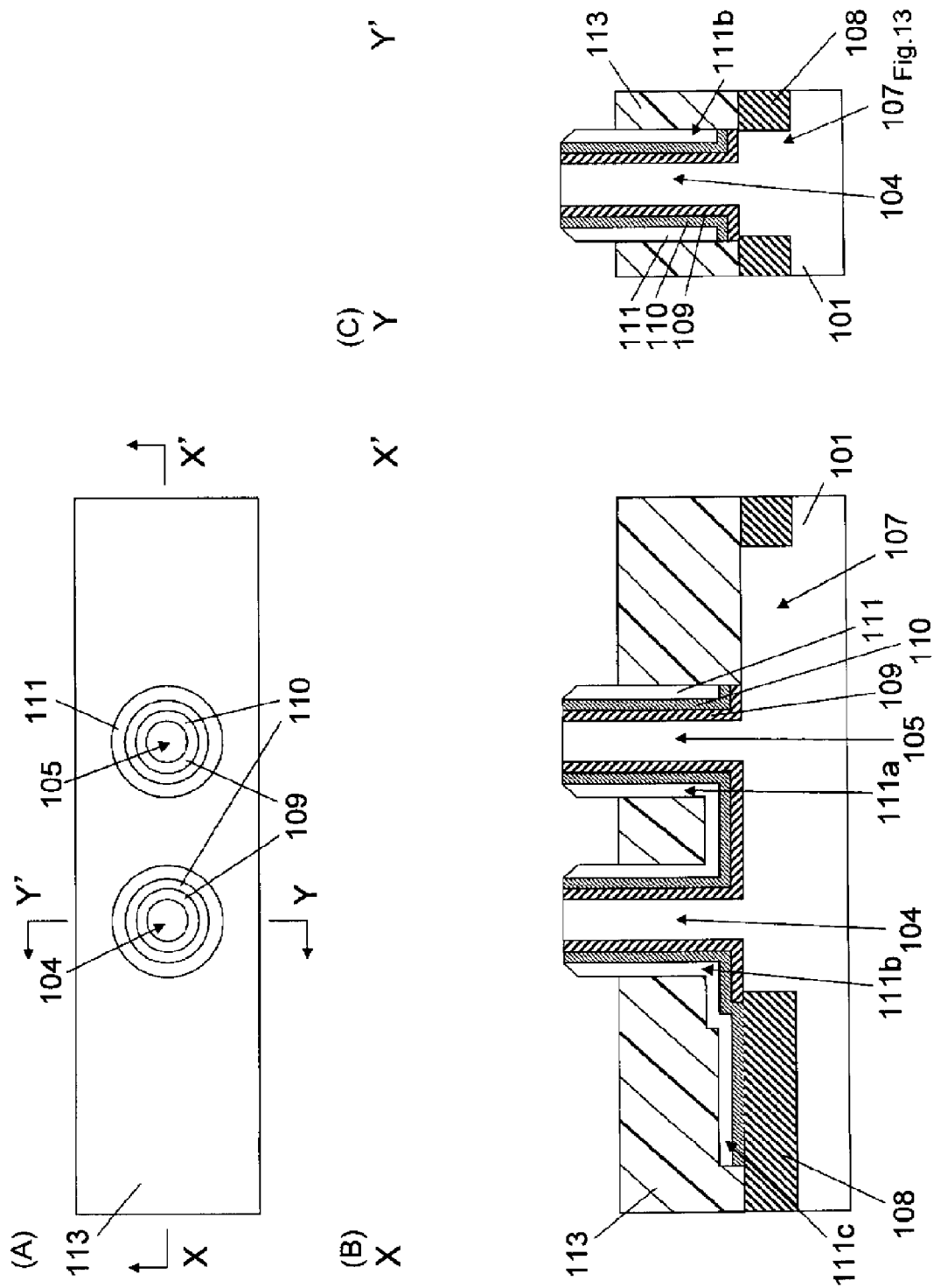

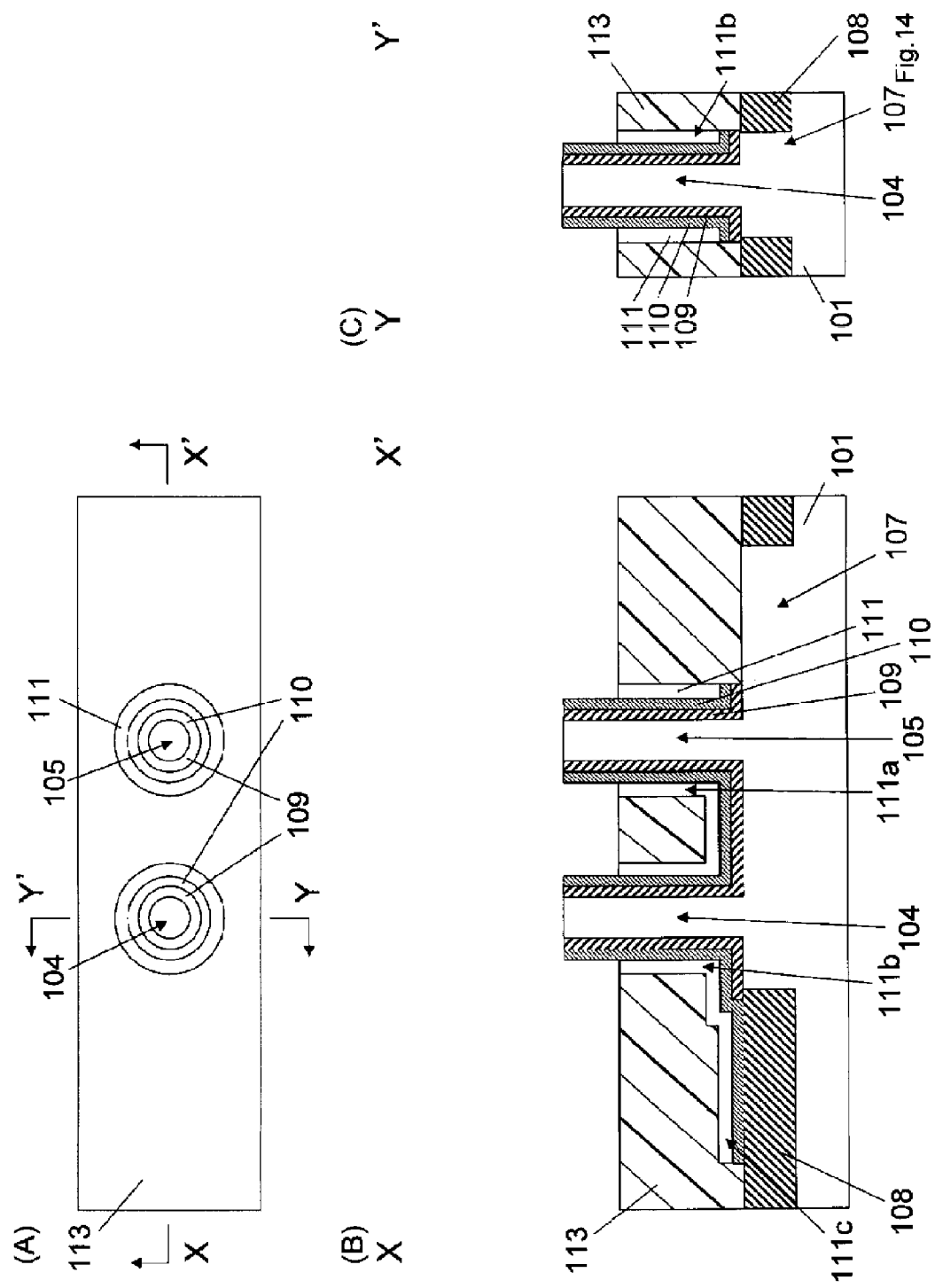

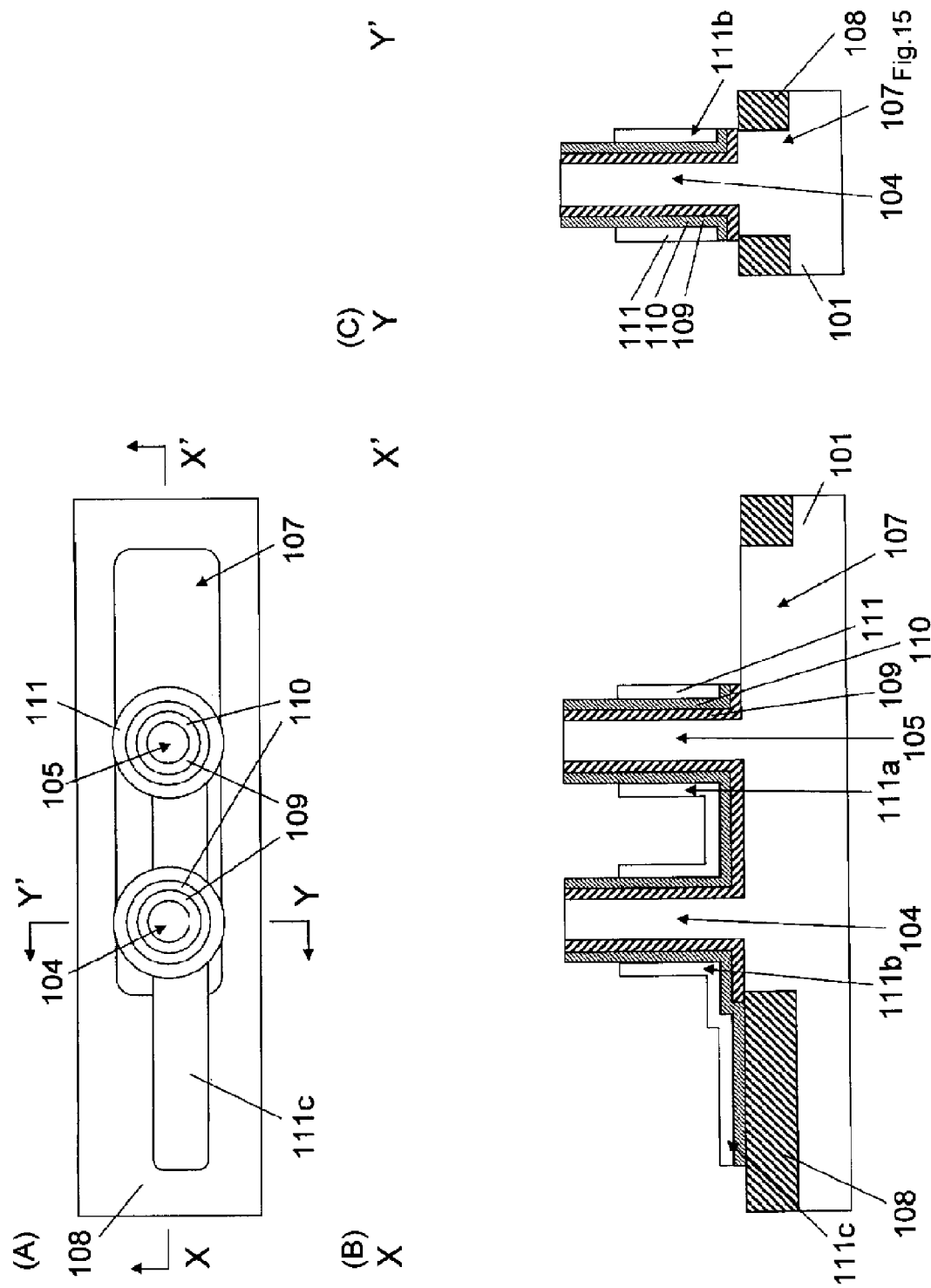

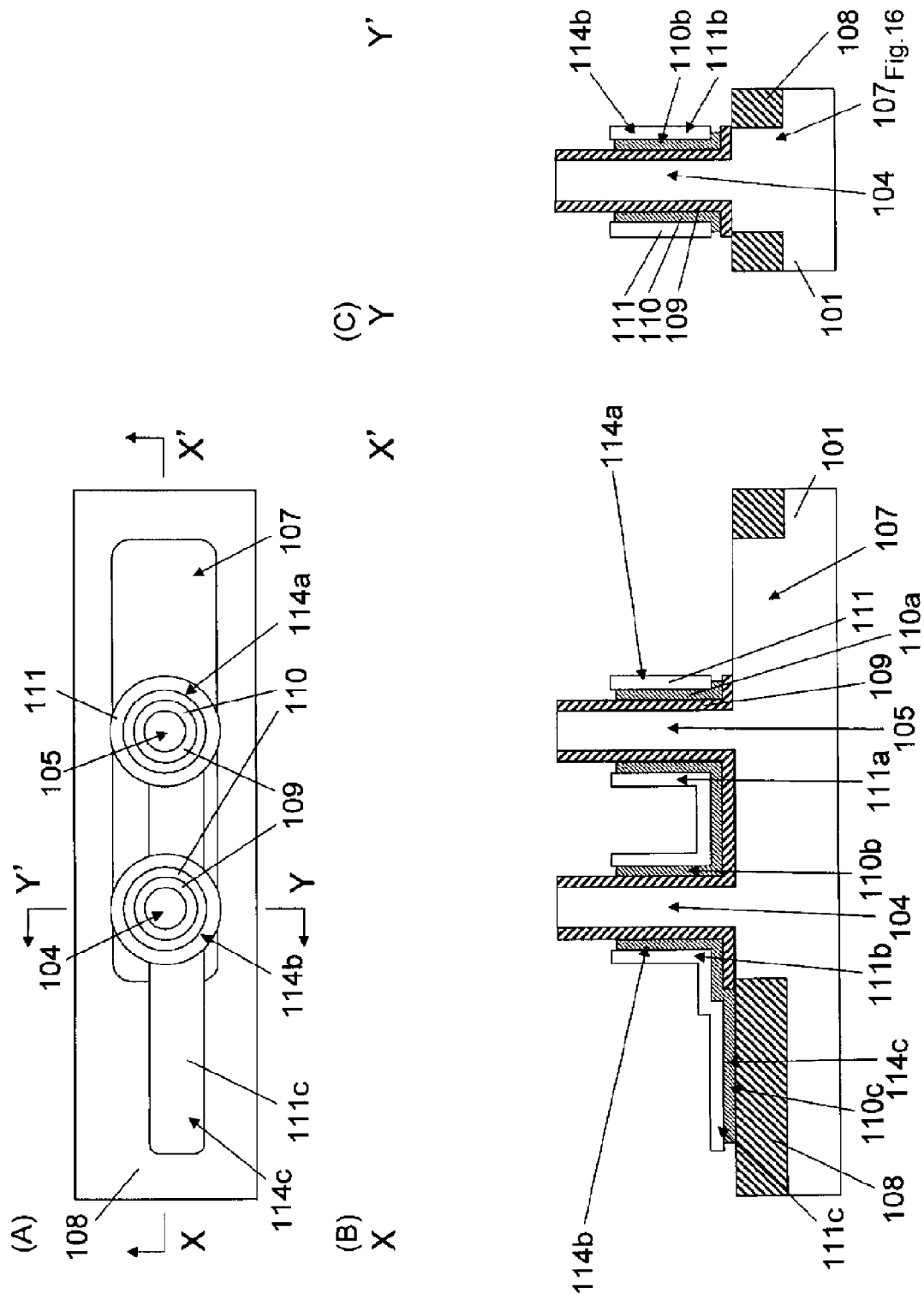

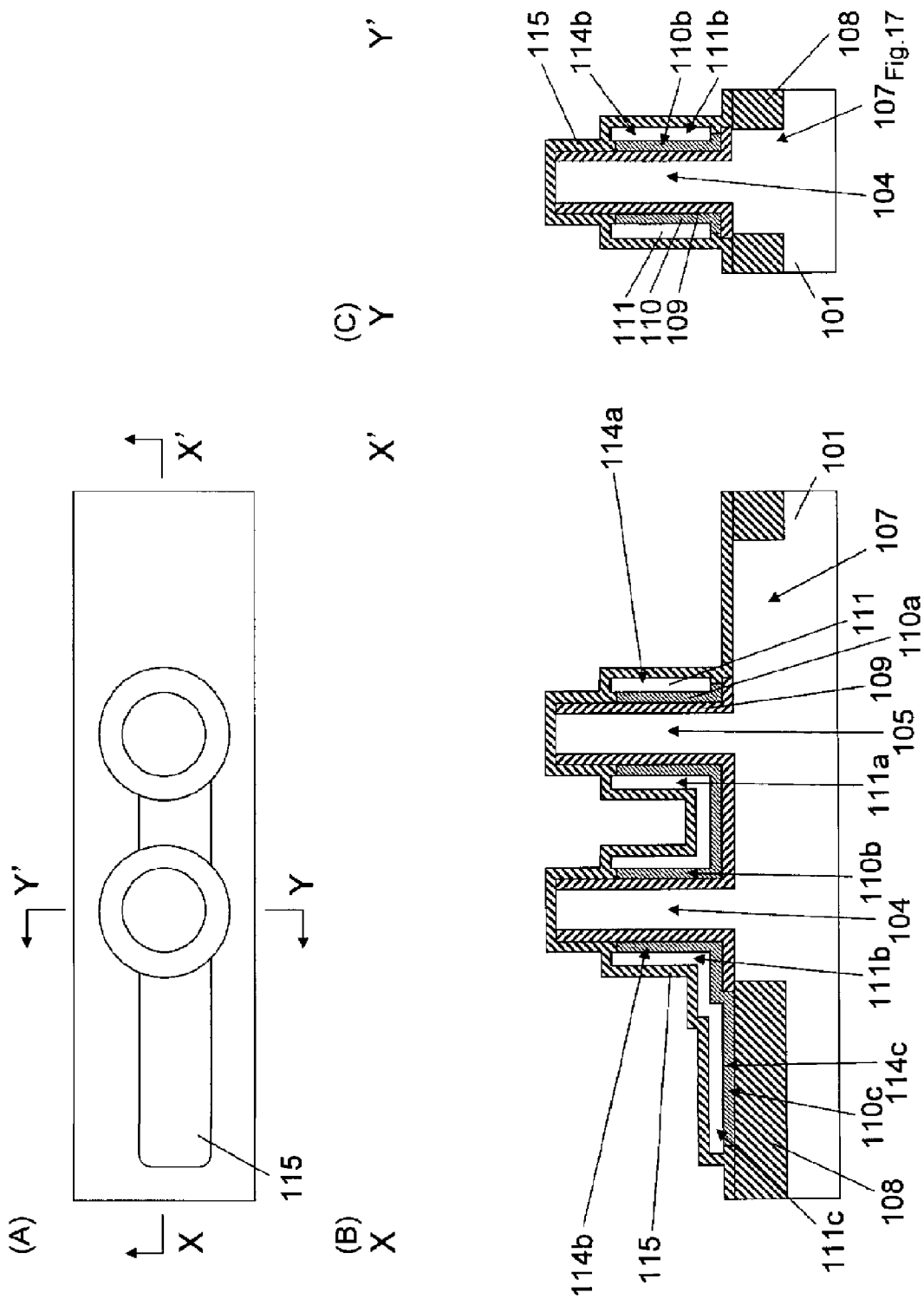

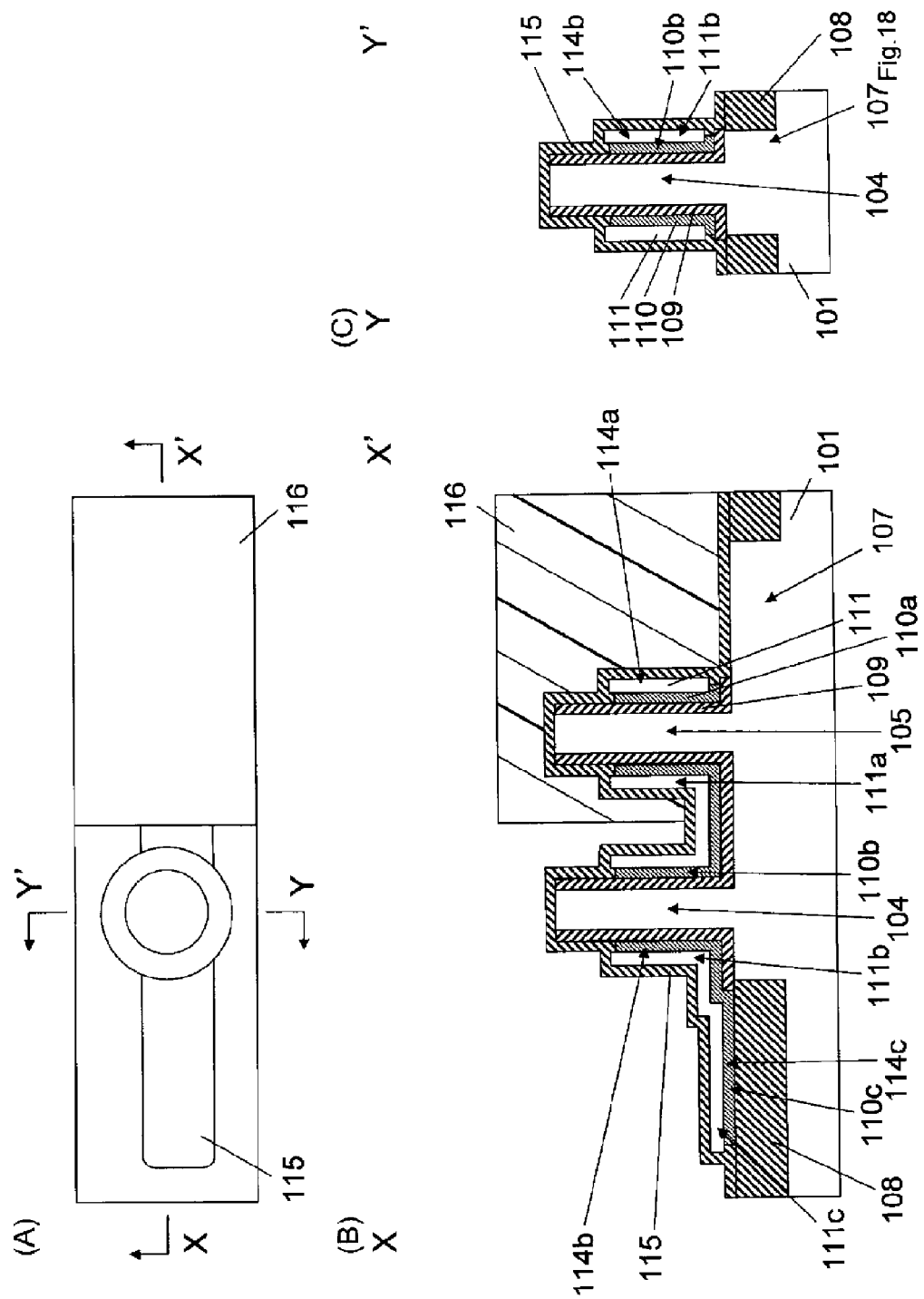

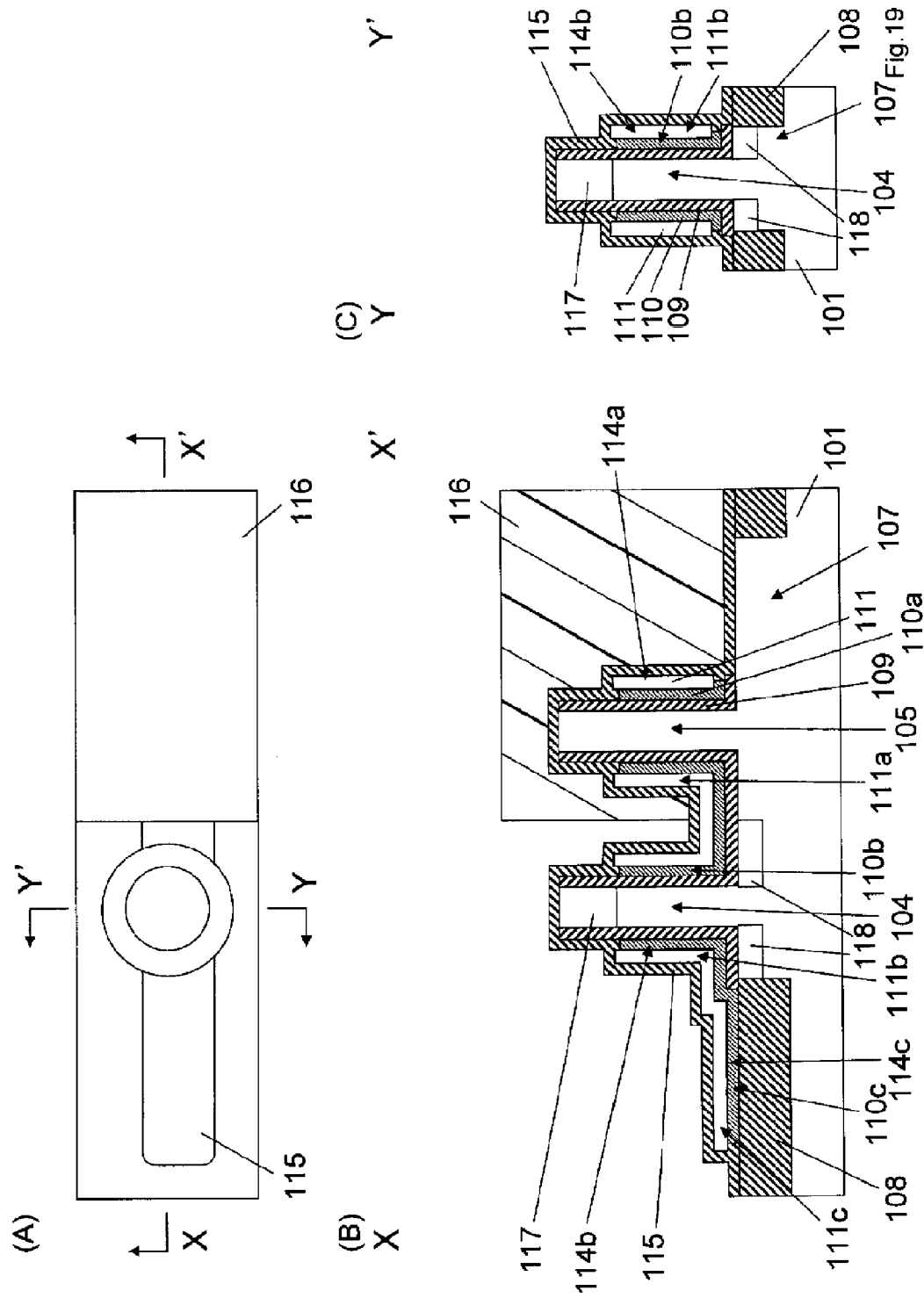

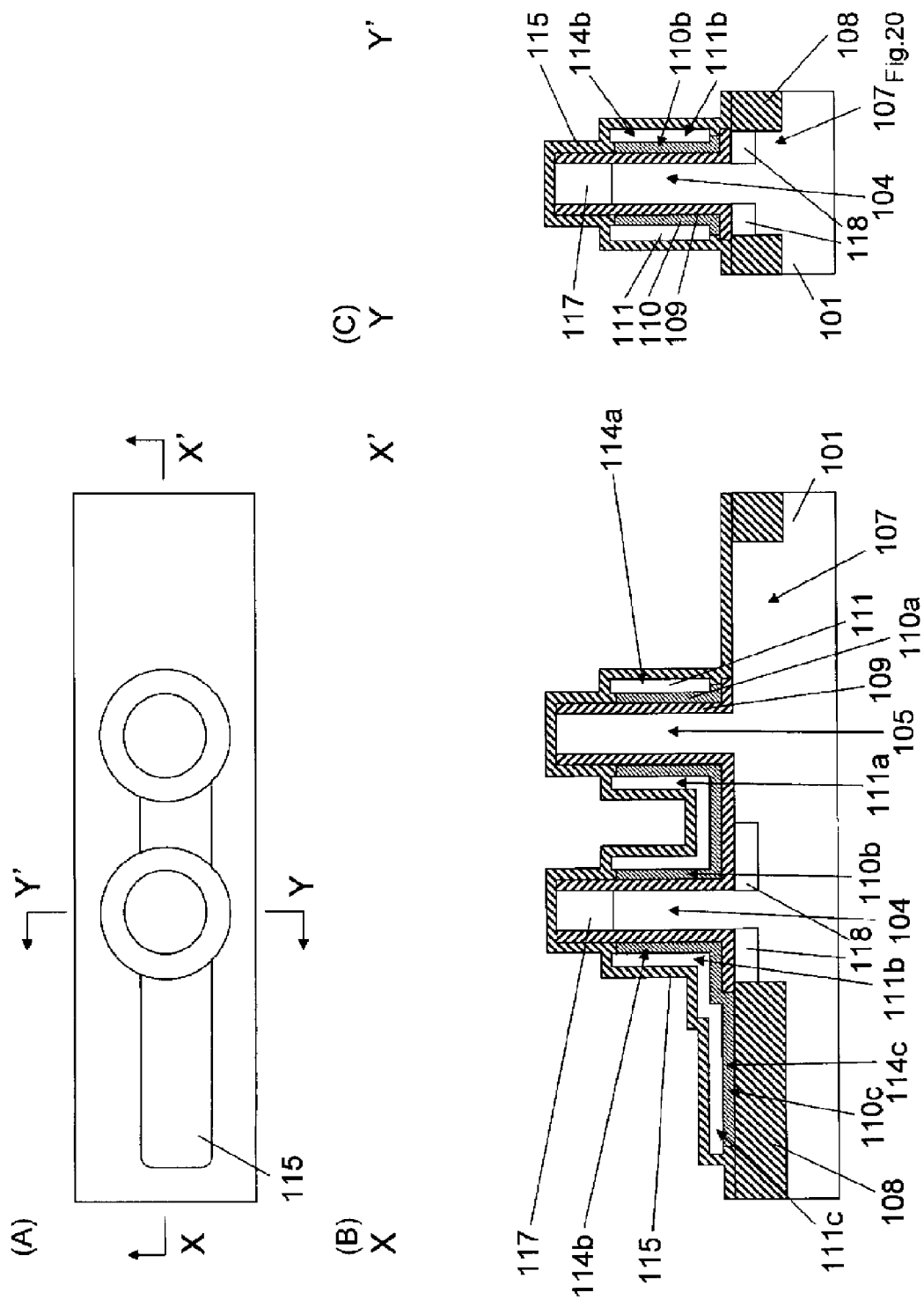

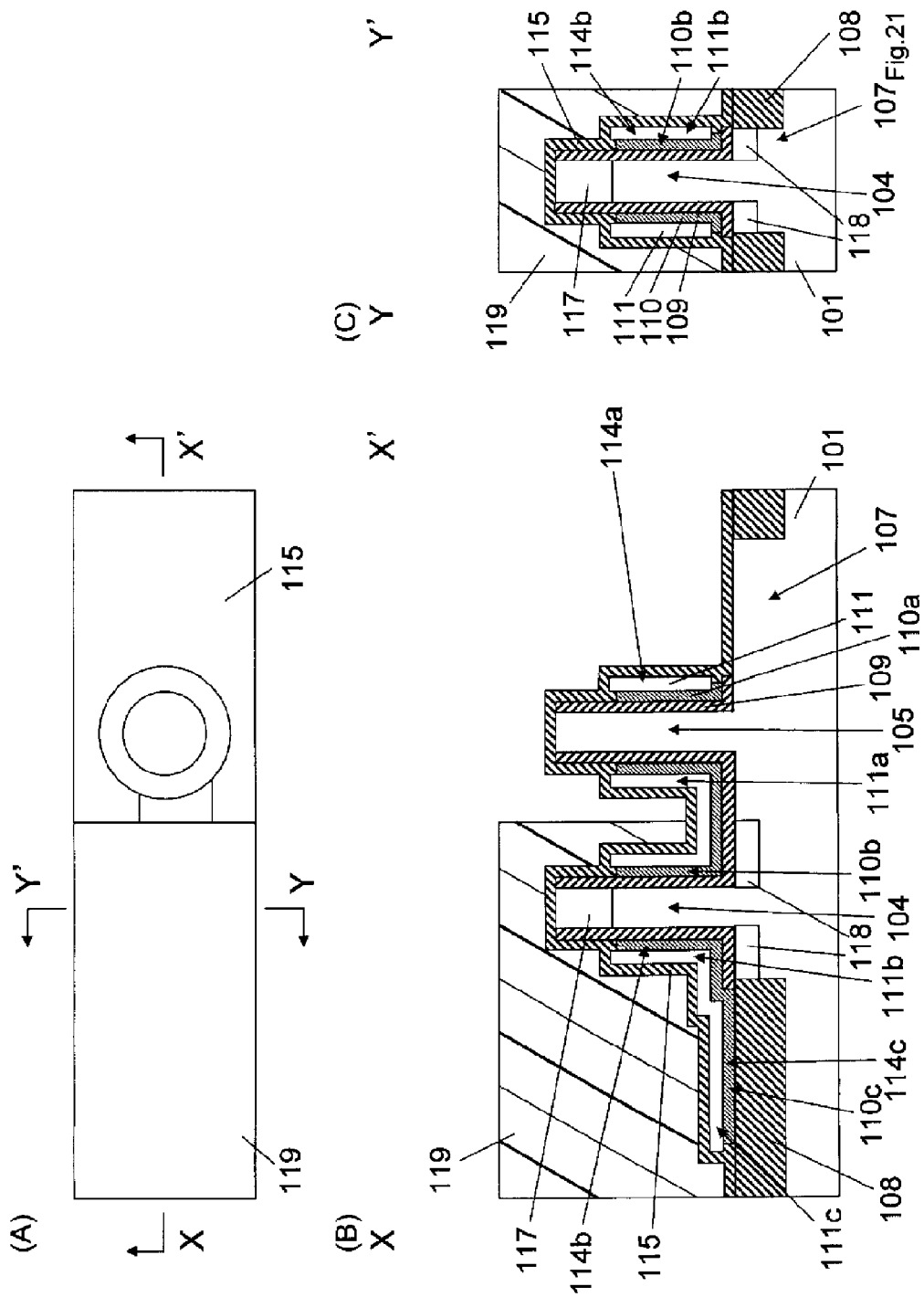

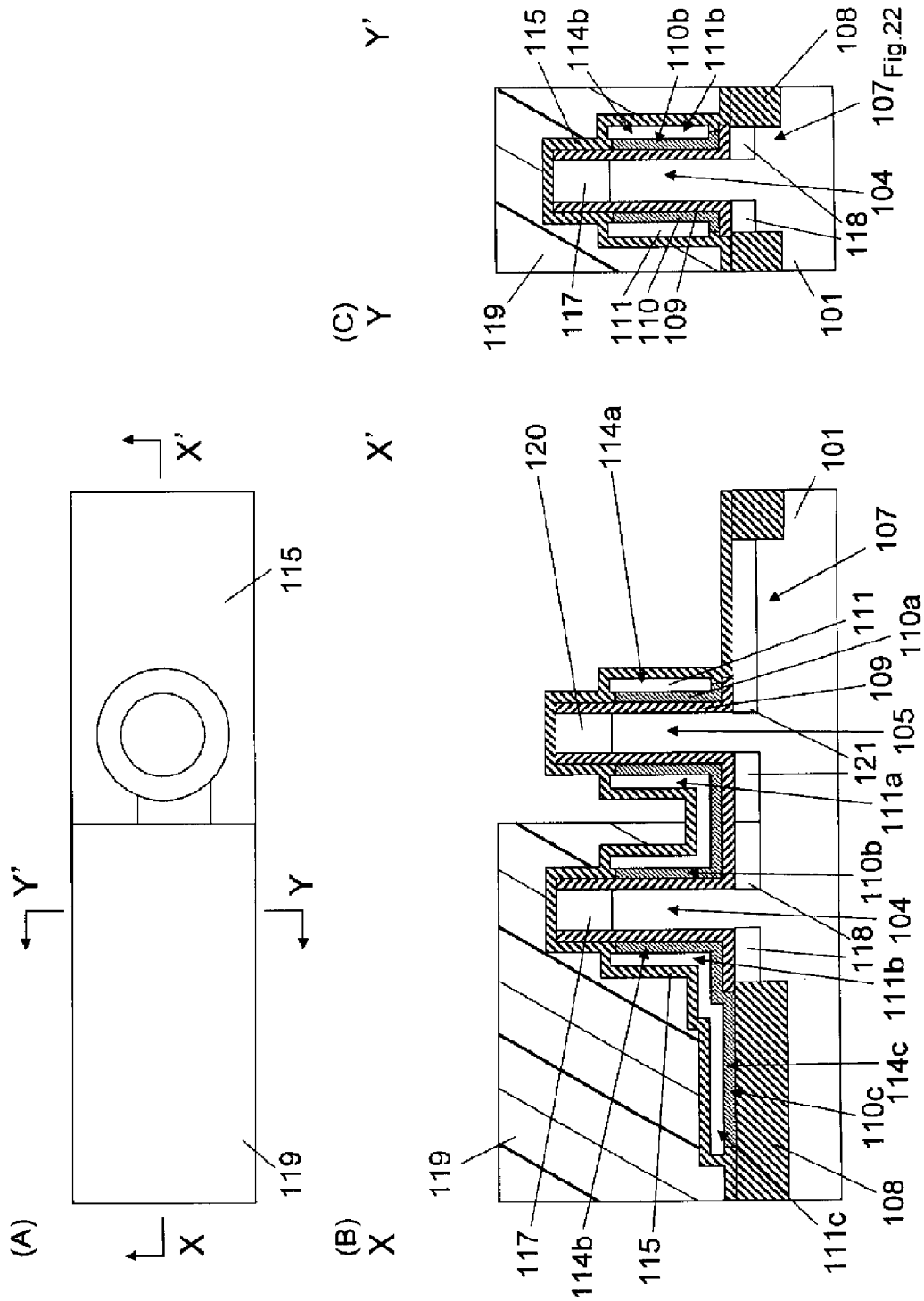

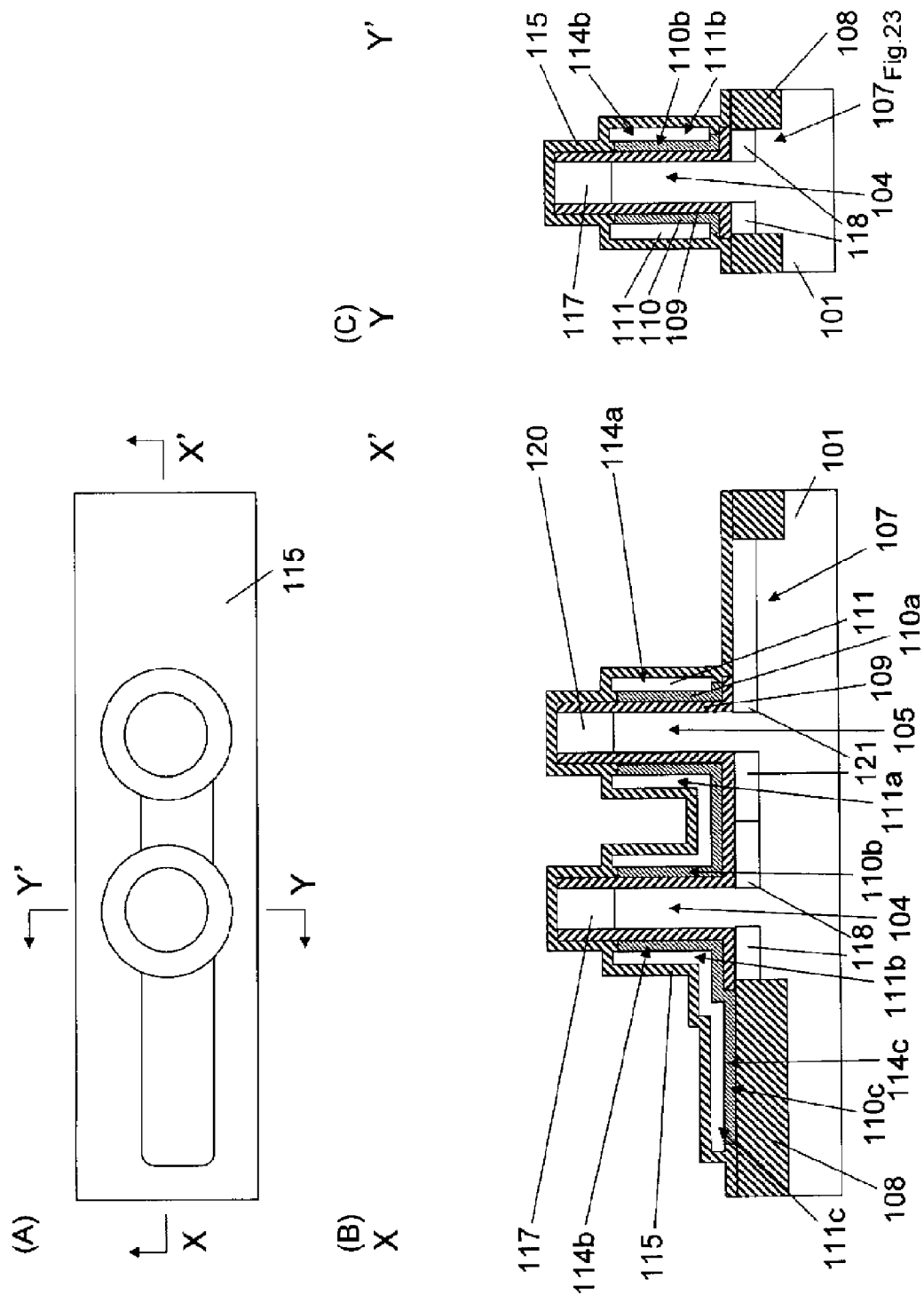

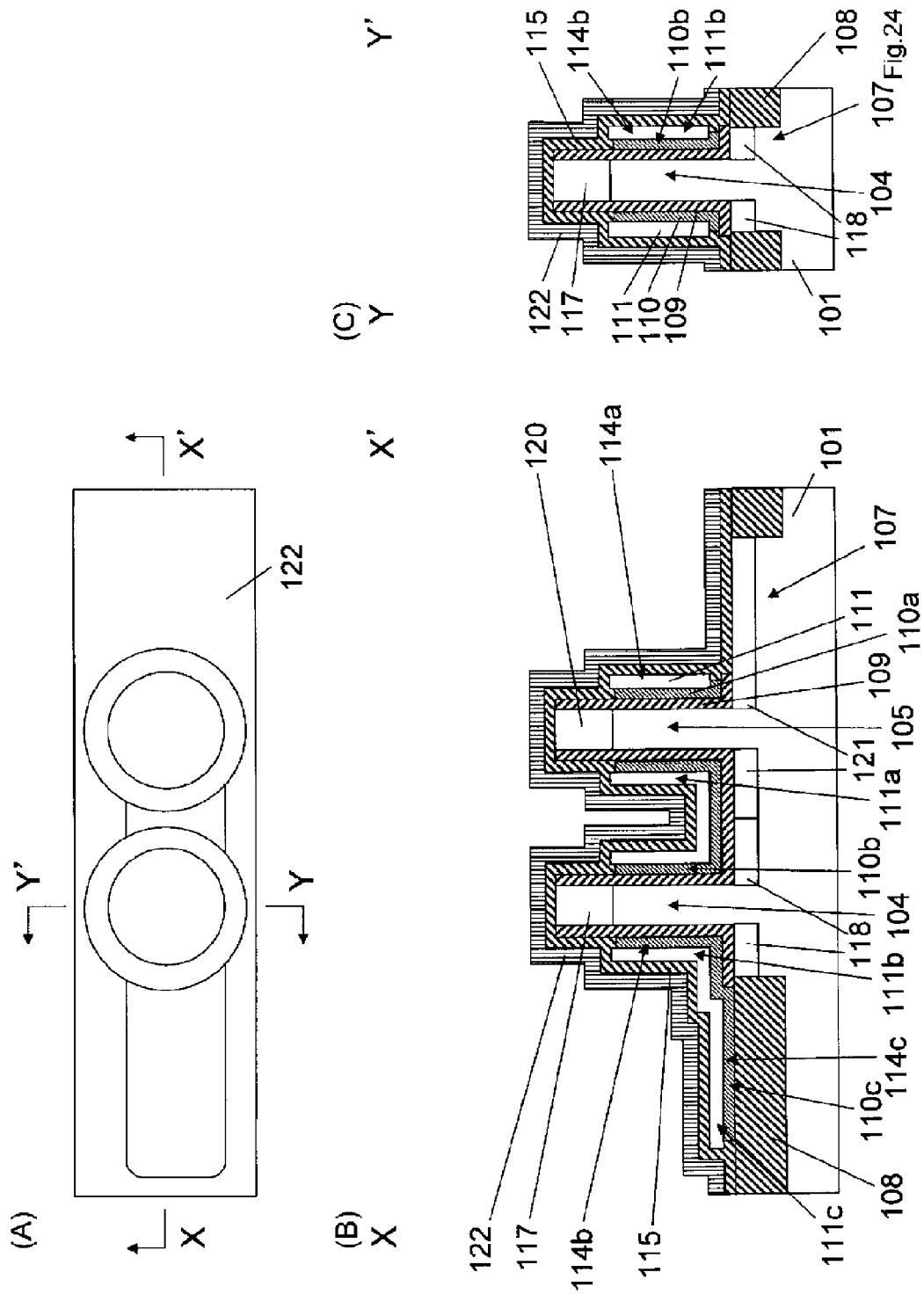

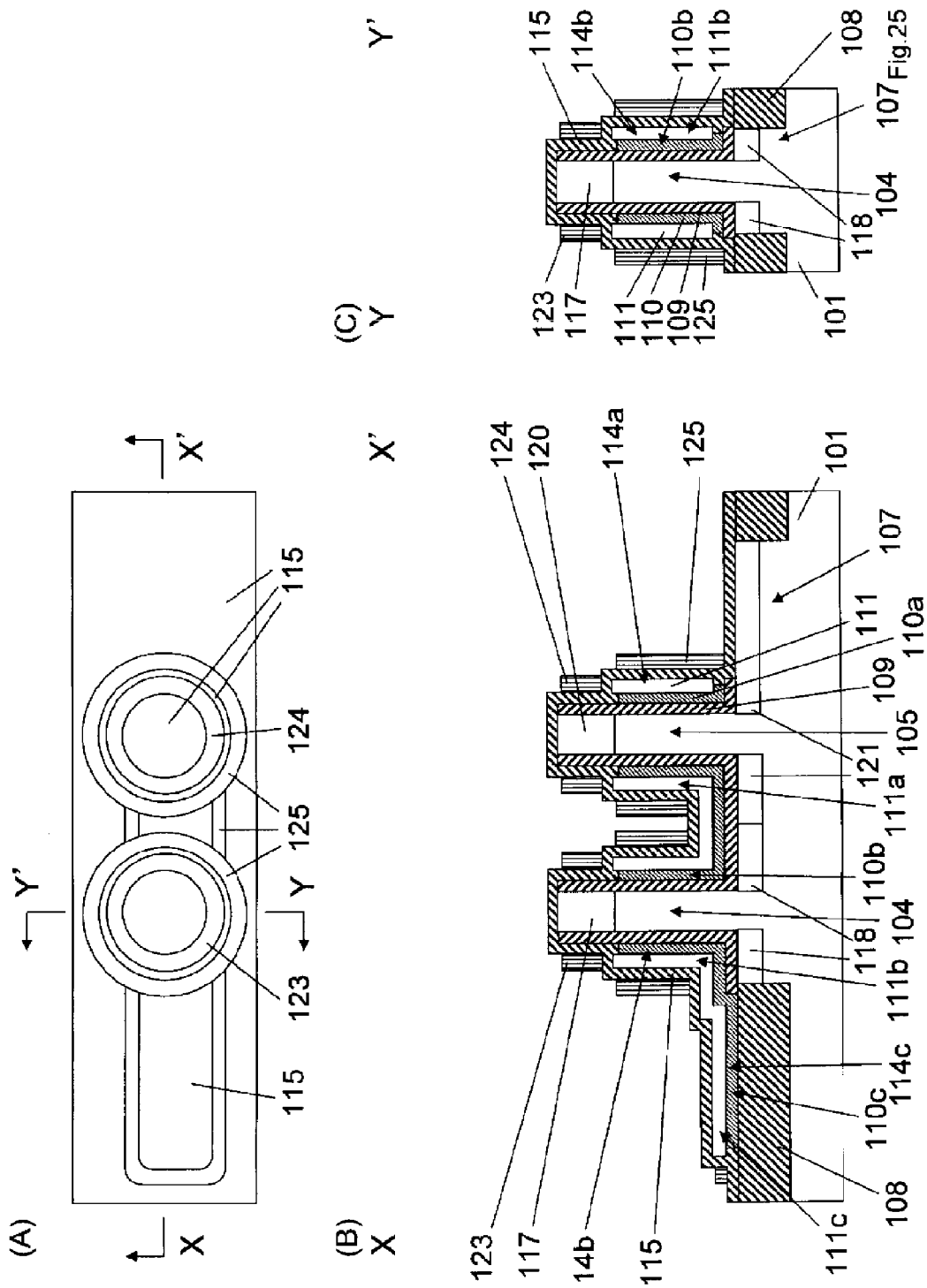

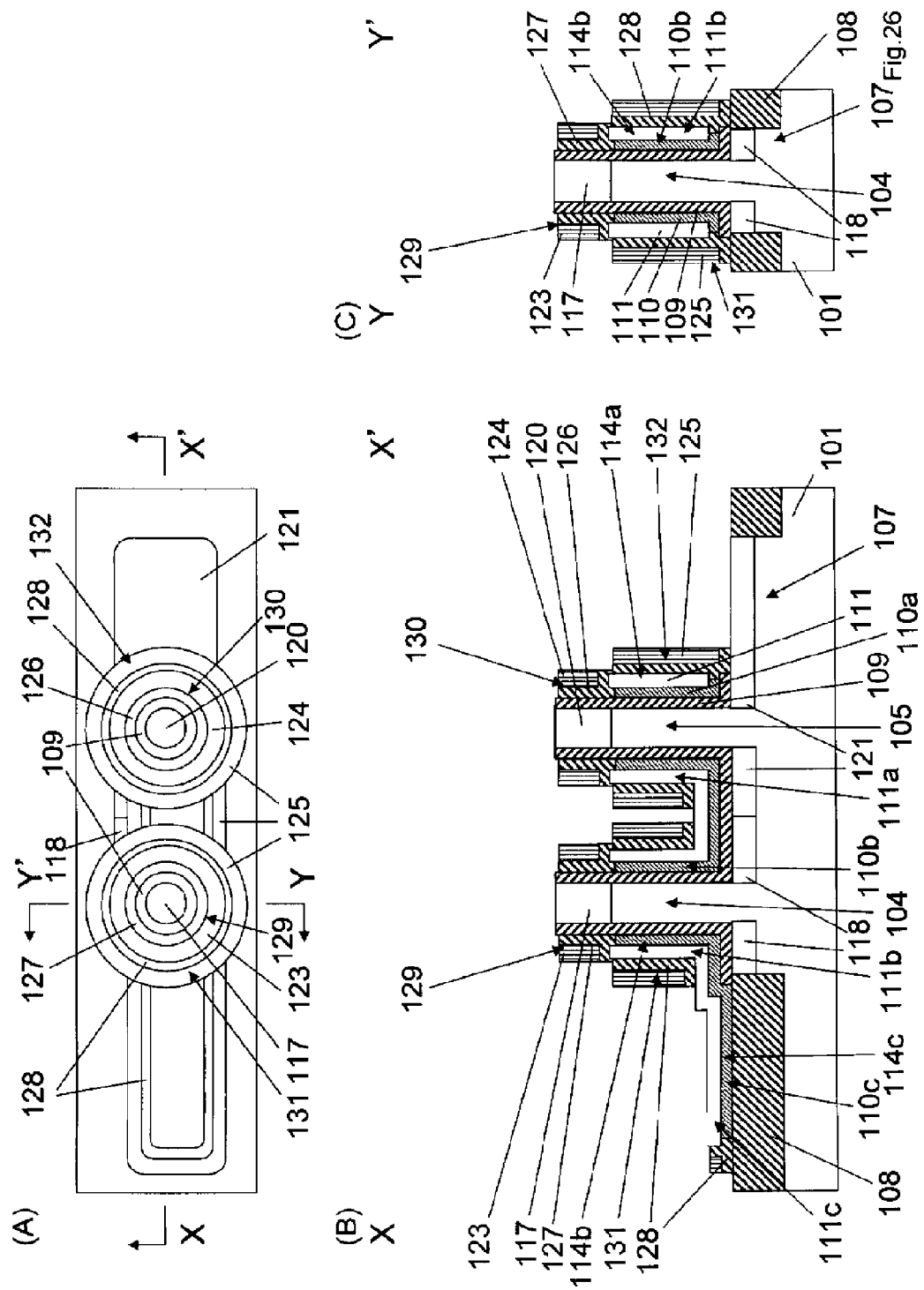

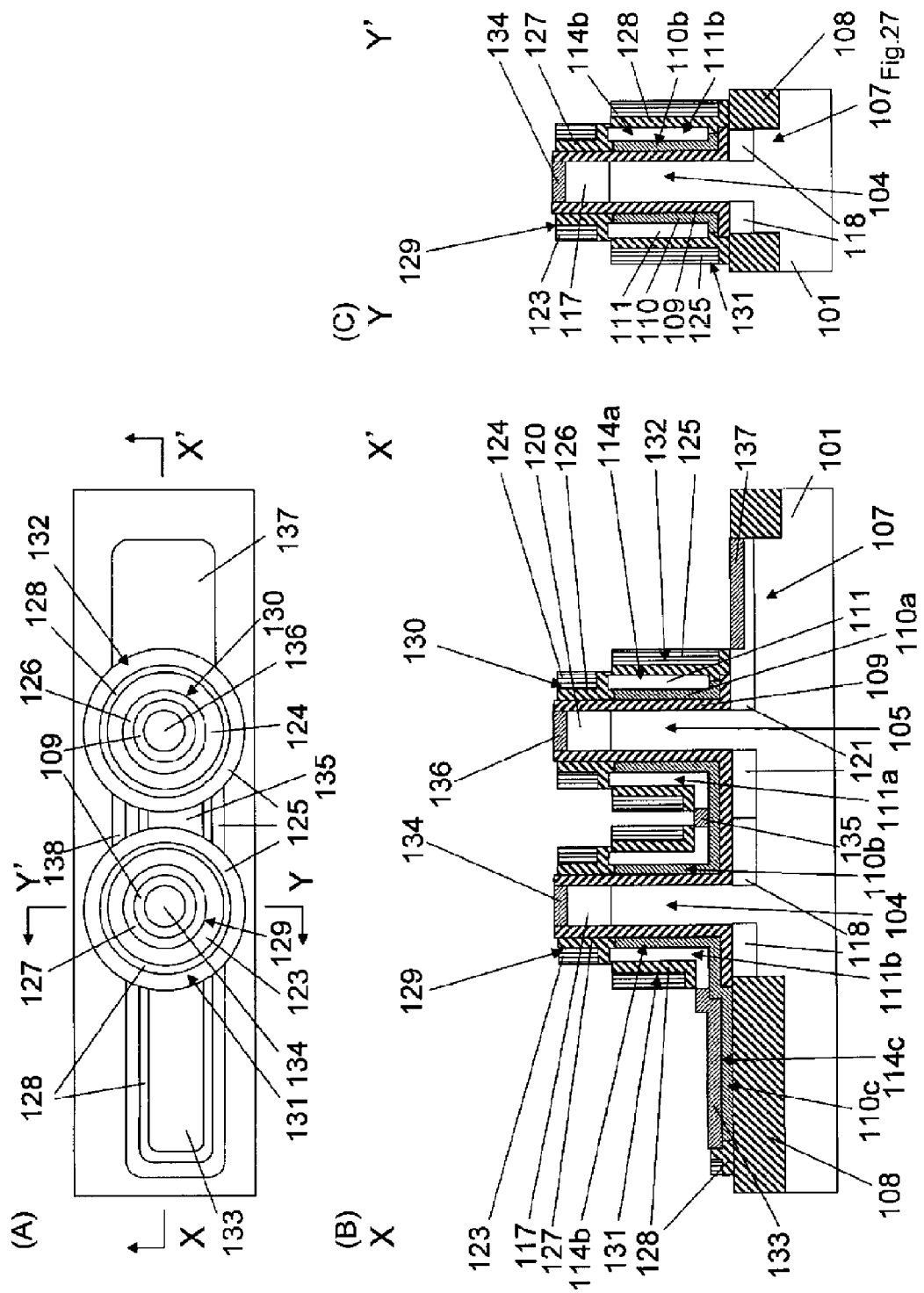

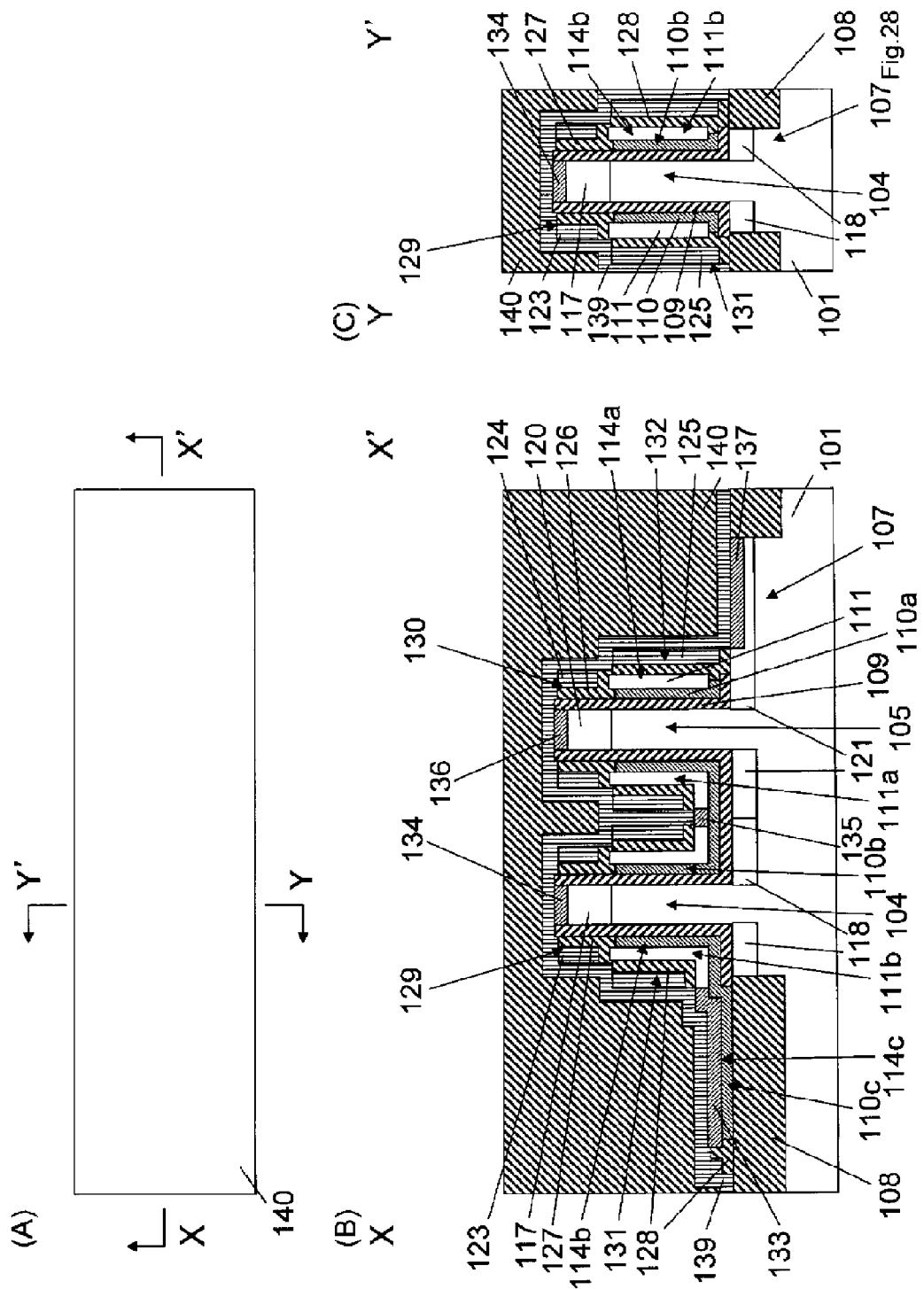

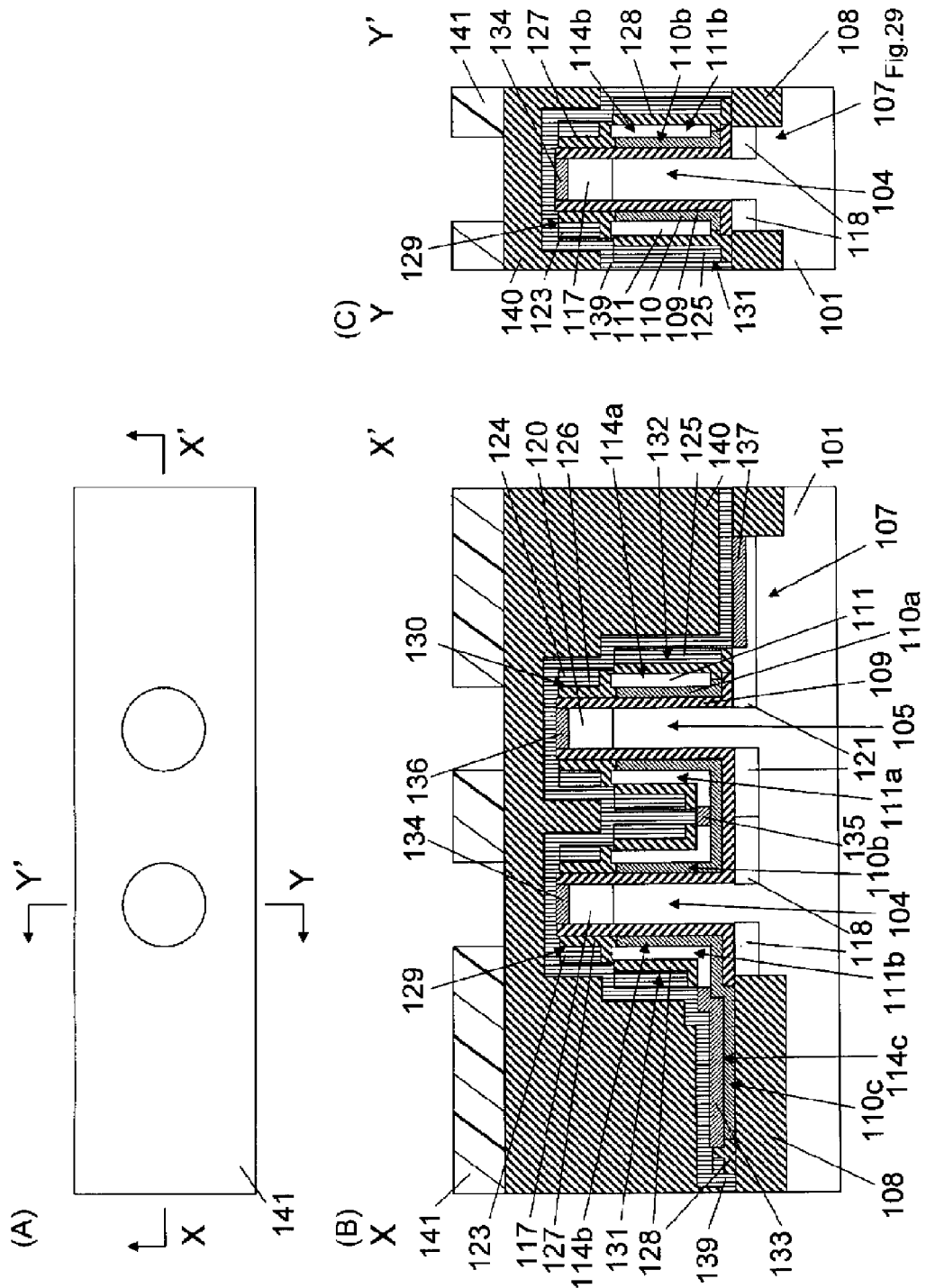

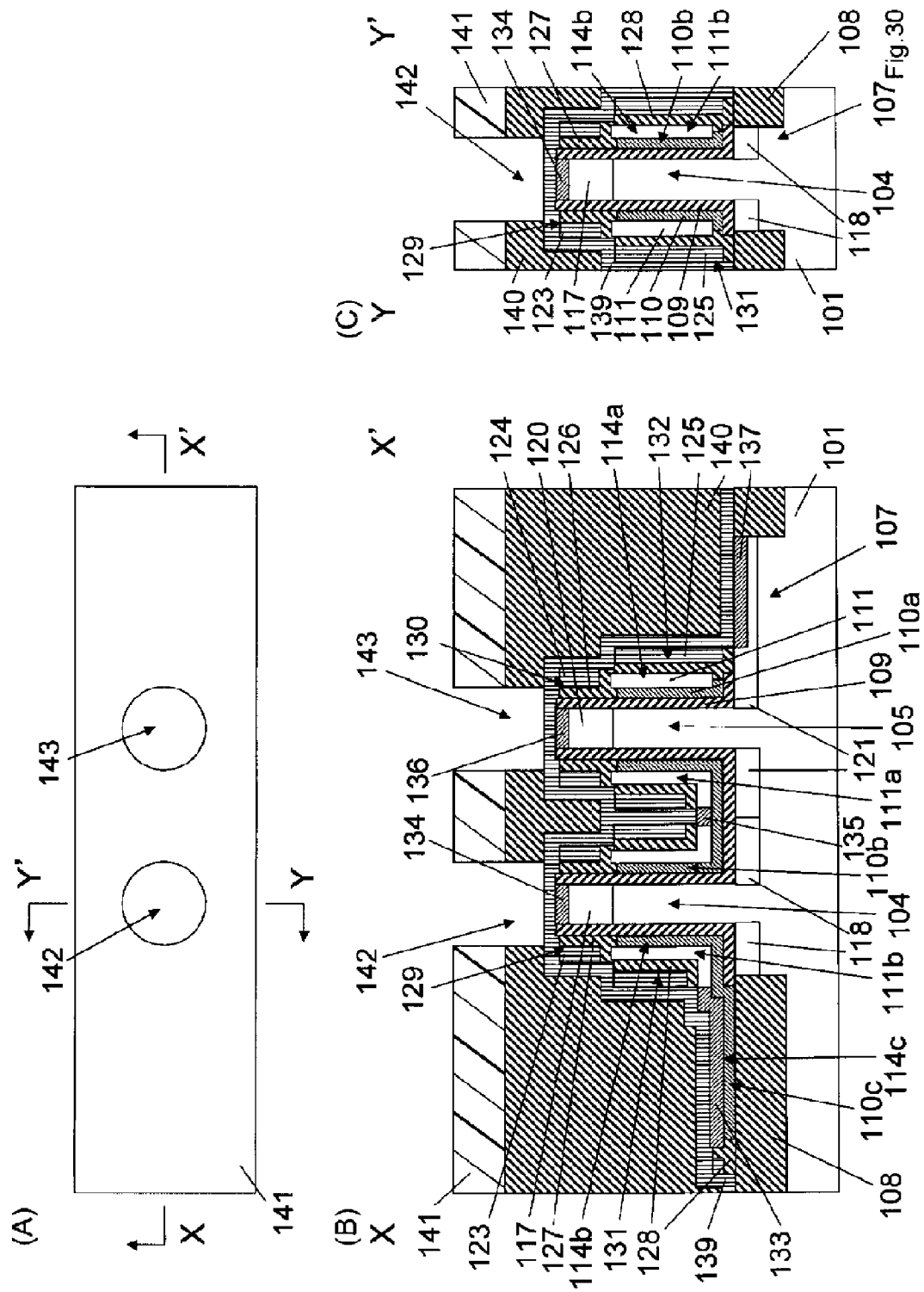

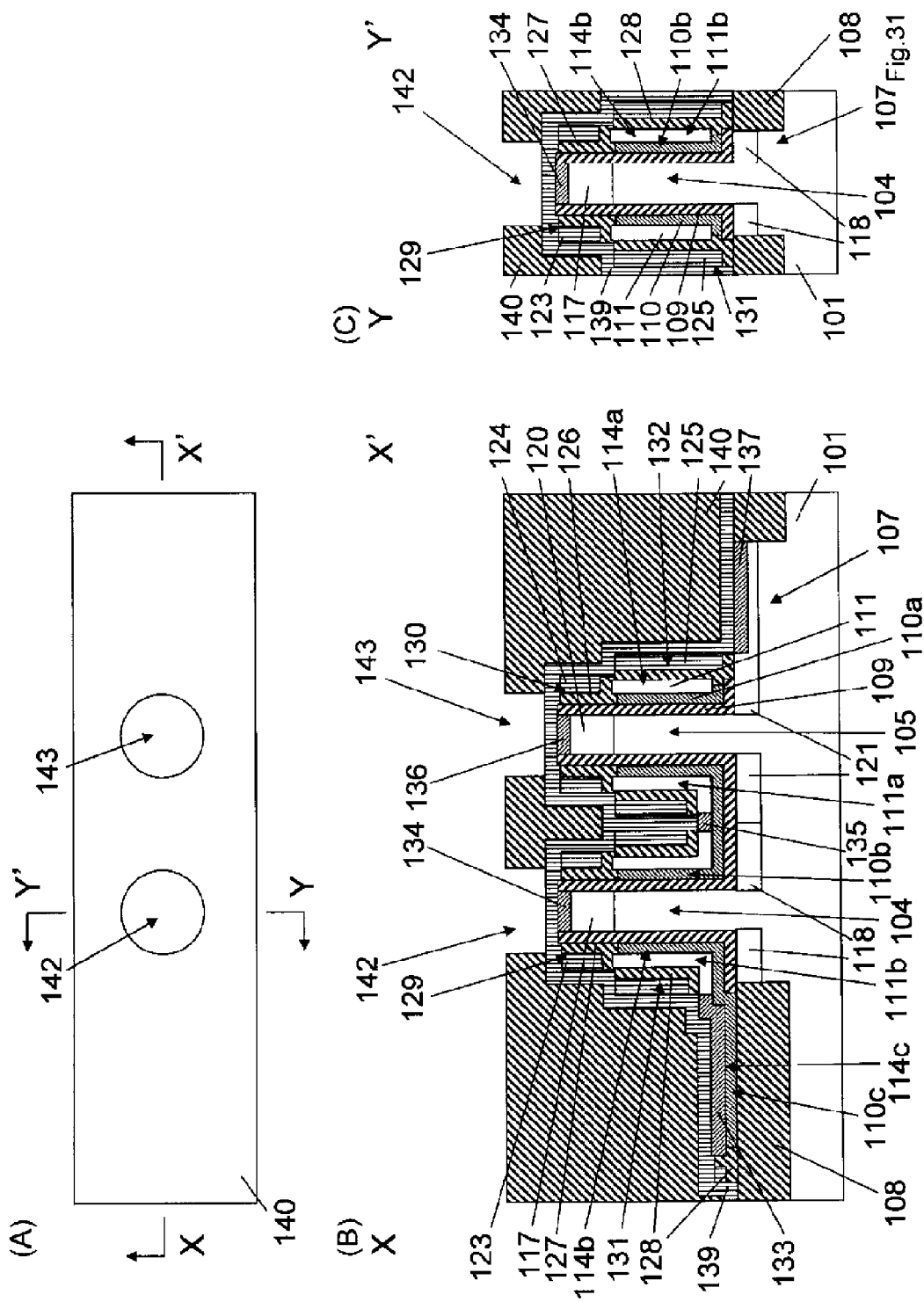

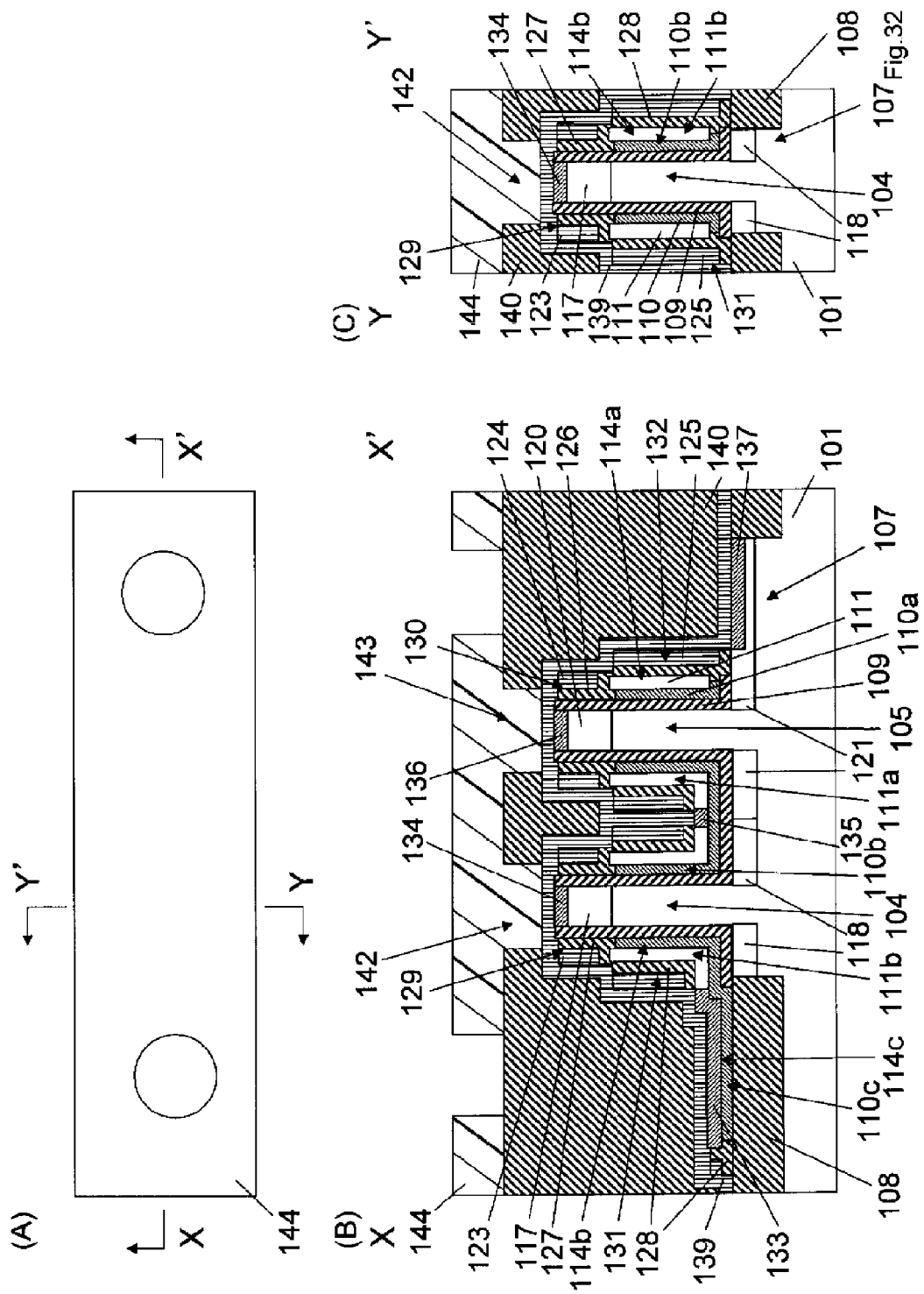

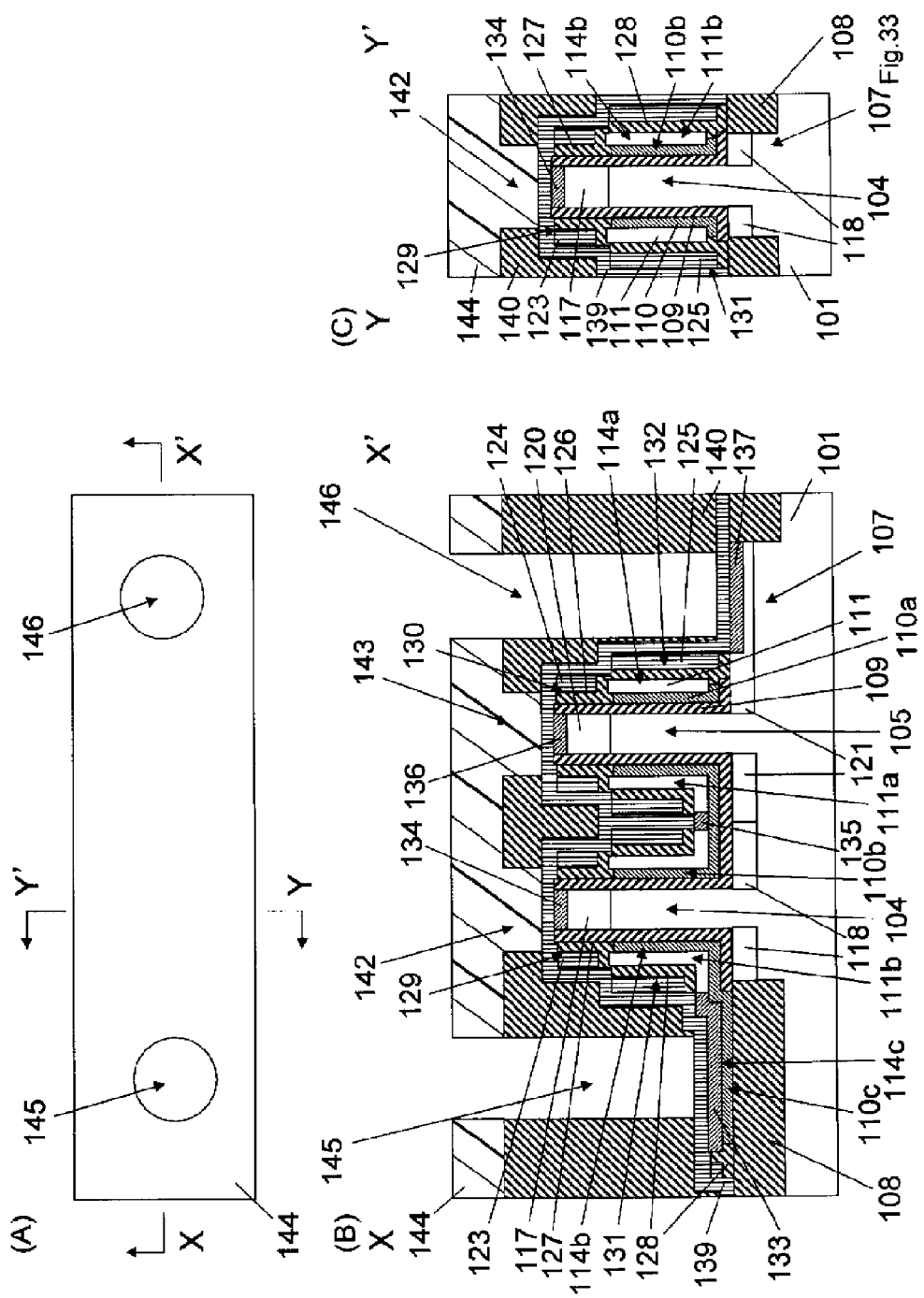

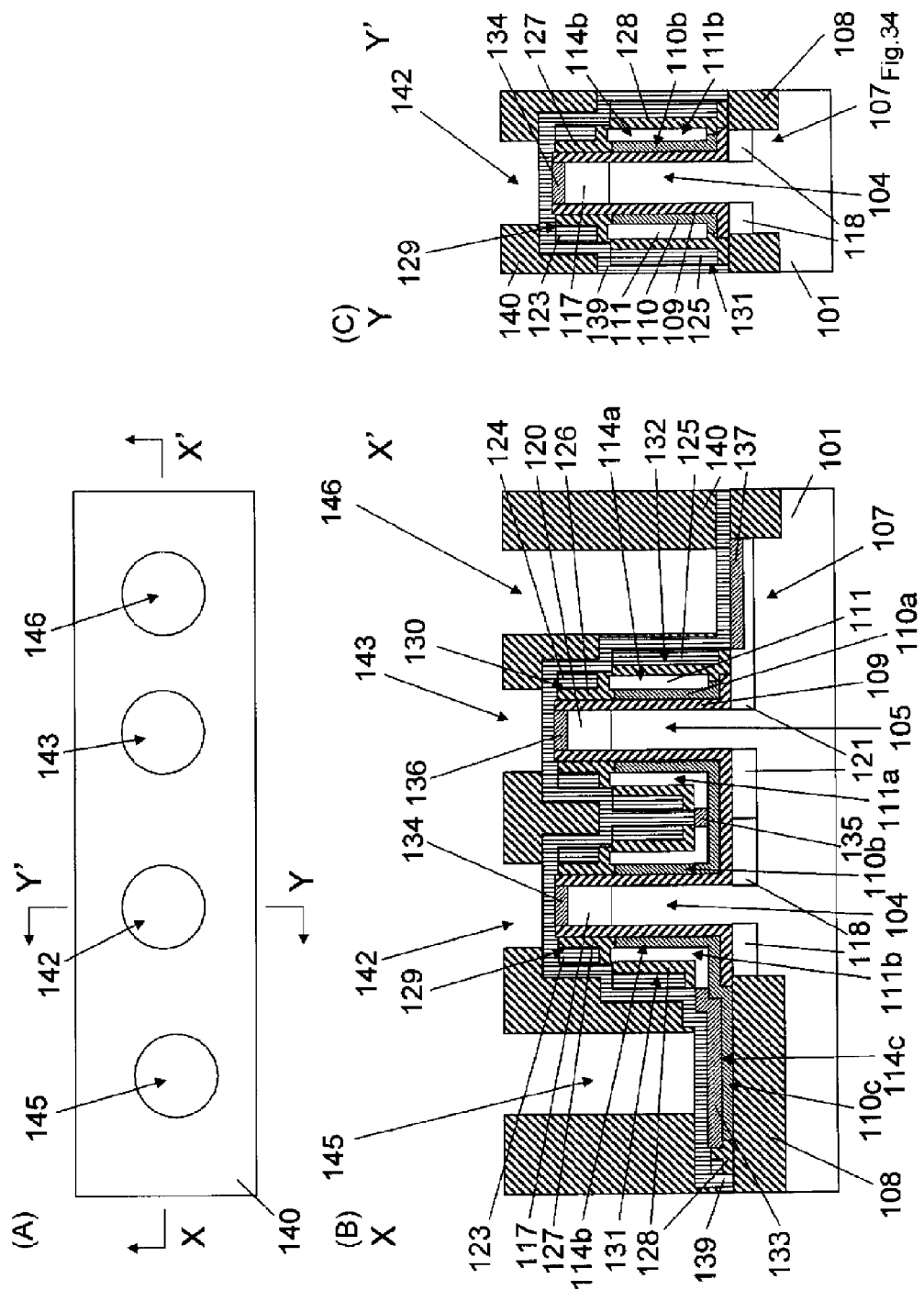

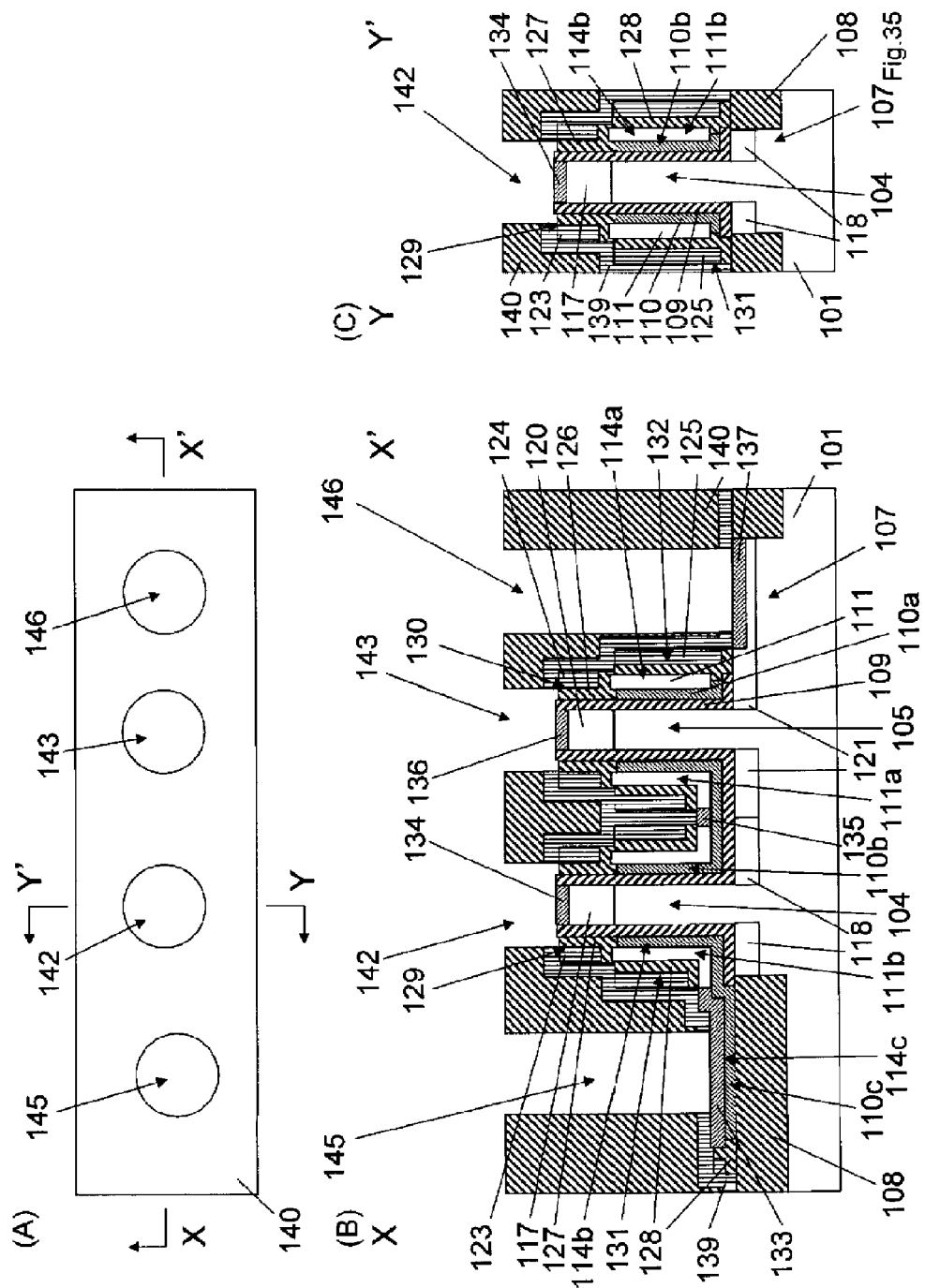

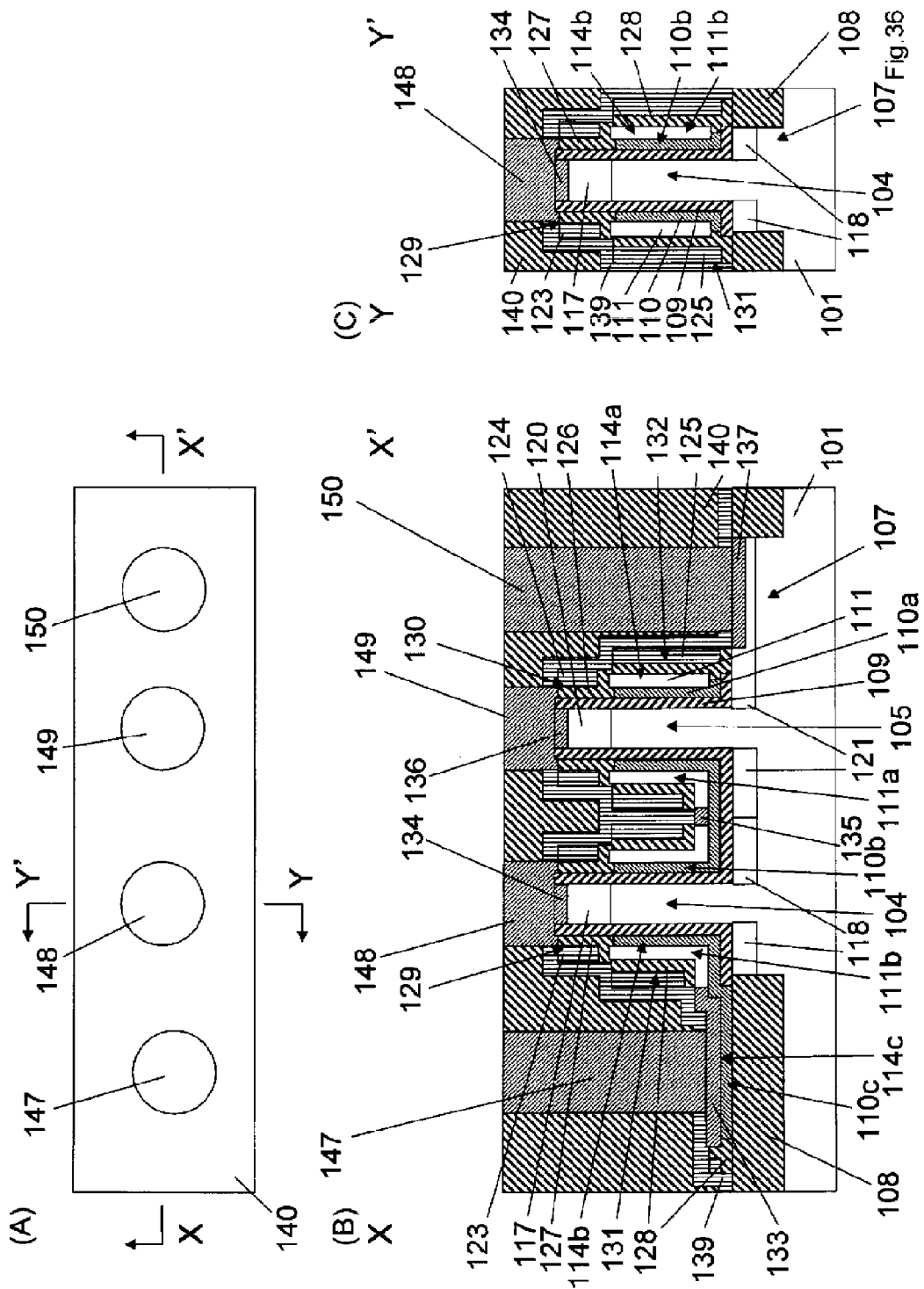

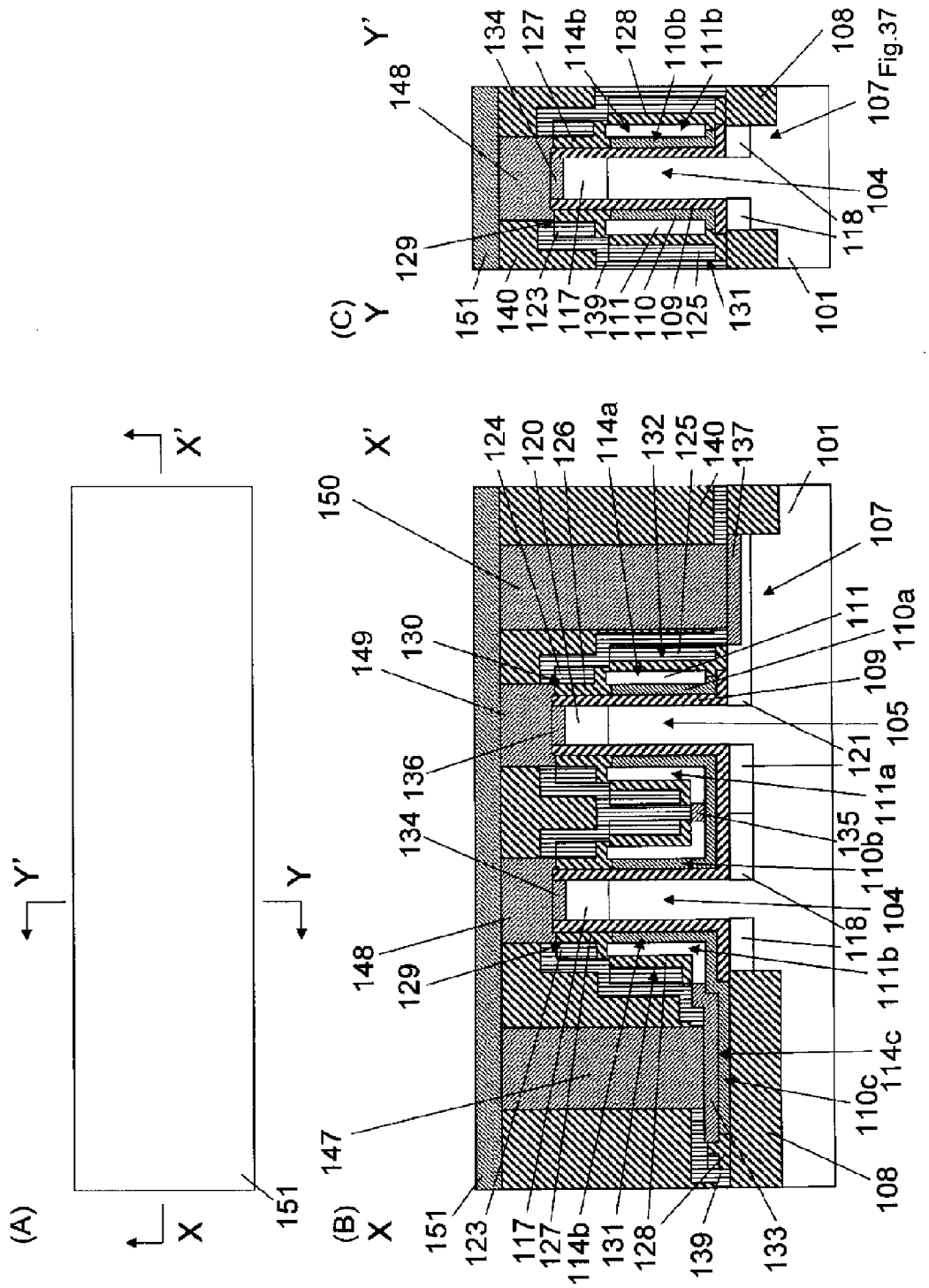

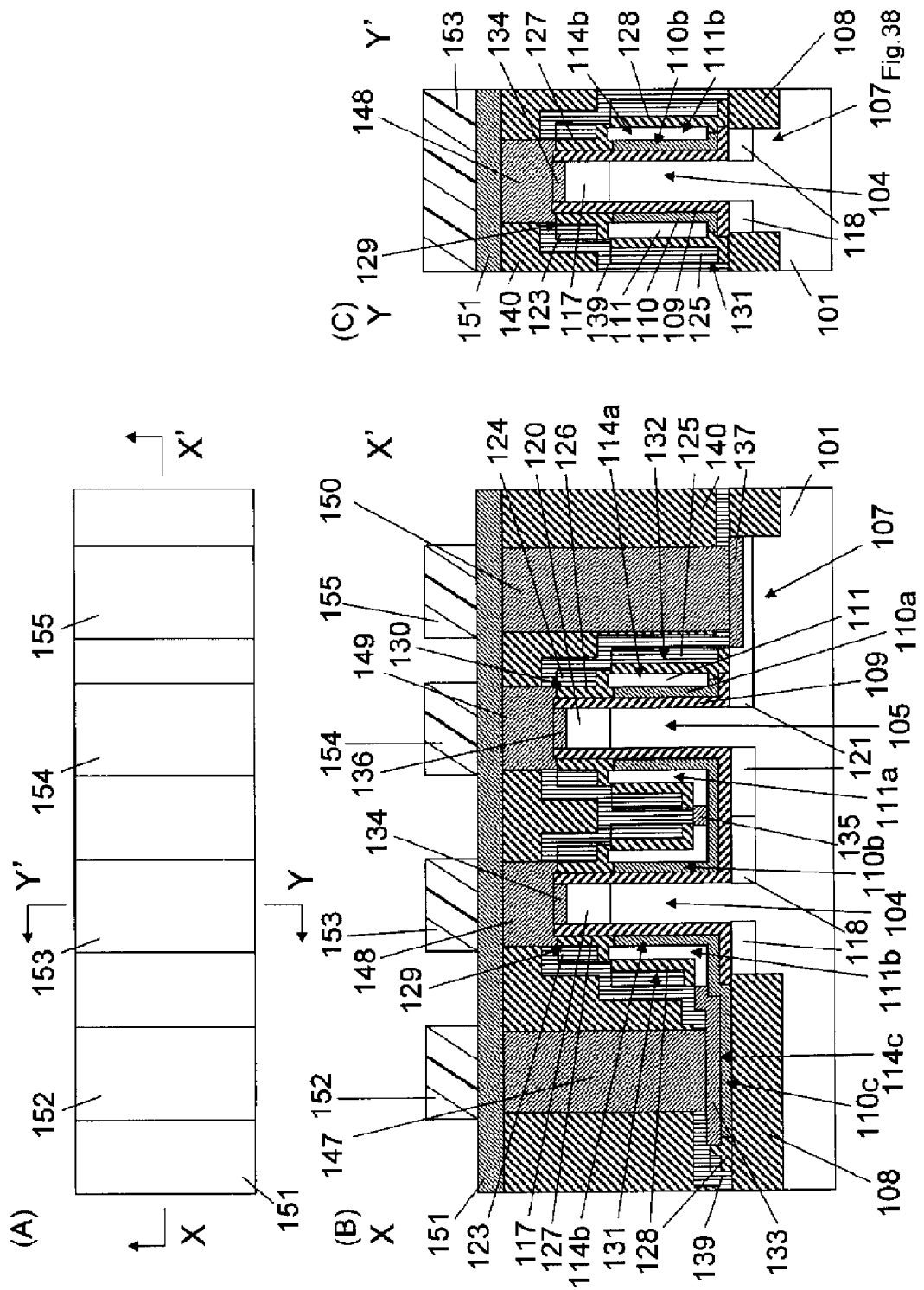

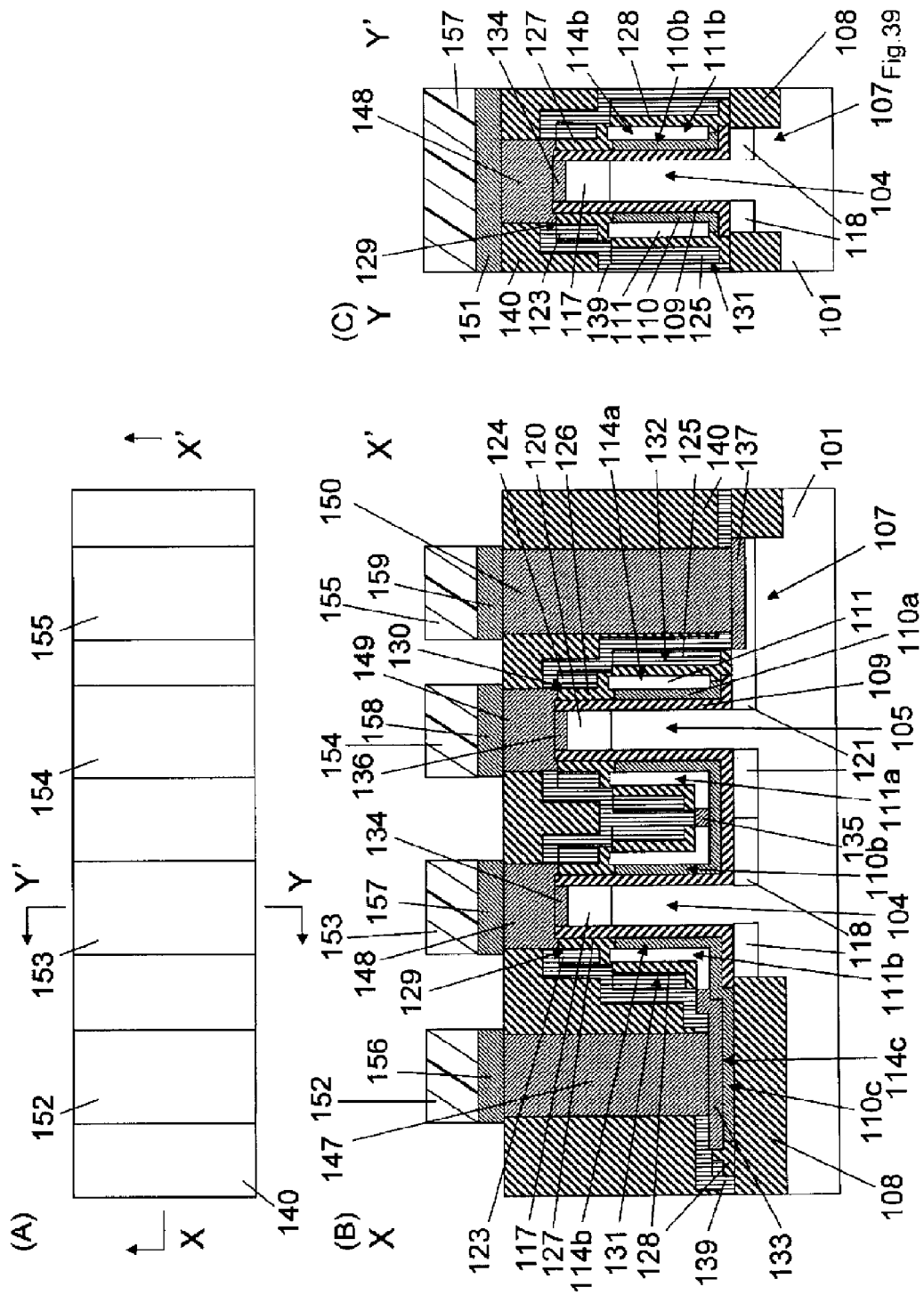

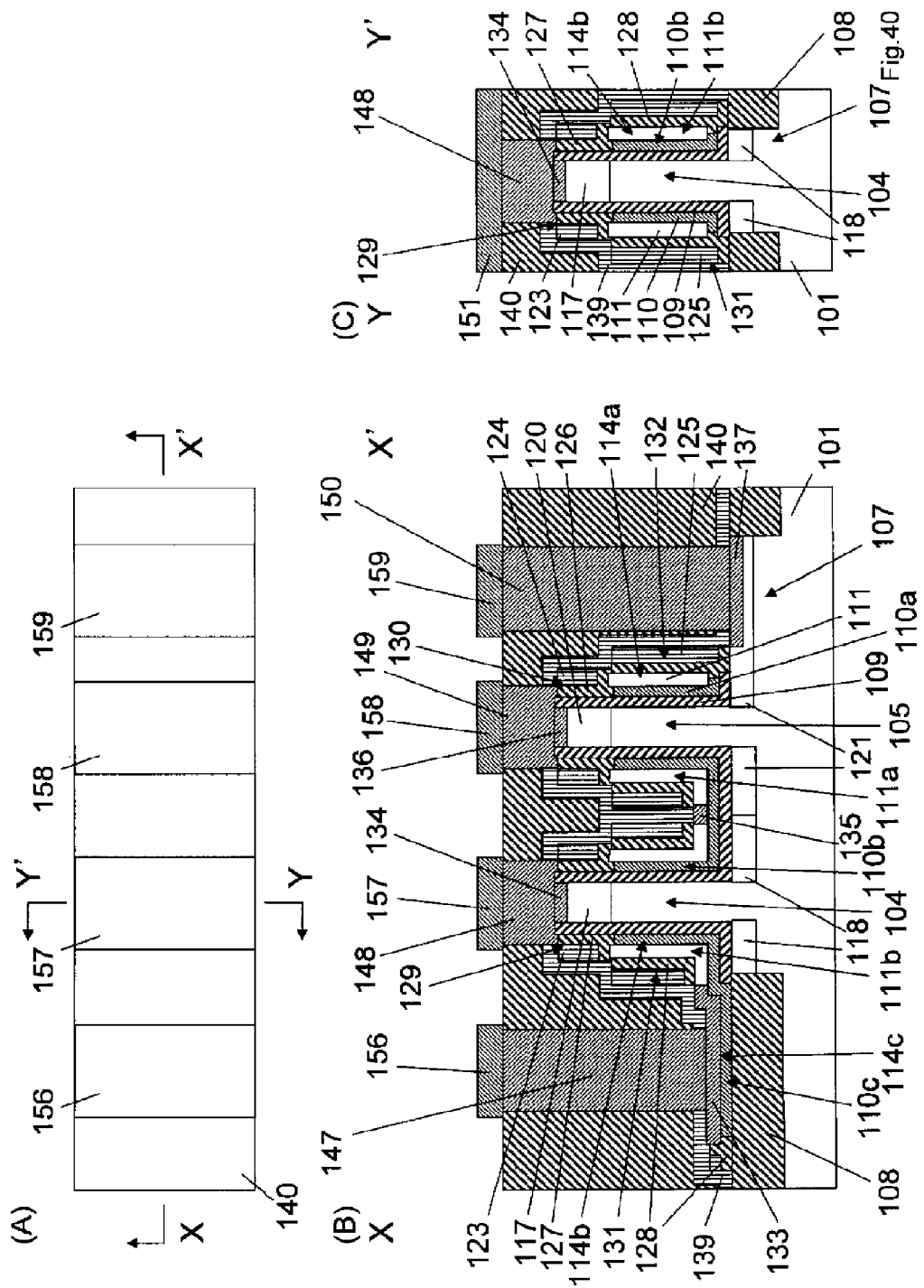

METHOD FOR PRODUCING SEMICONDUCTOR DEVICE AND SEMICONDUCTOR DEVICE

CROSS REFERENCES TO RELATED APPLICATIONS

Pursuant to 35 U.S.C. §119(e), this application claims the benefit of the filing date of Provisional U.S. Patent Application Ser. No. 61/657,138 filed on Jun. 8, 2012. The entire content of this application is hereby incorporated by reference.

BACKGROUND OF THE INVENTION

1. Field of the Invention

The present invention relates to a method for producing a semiconductor device and a semiconductor device.

2. Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

In an existing method for producing an SGT, a silicon pillar on which a nitride film hard mask is formed in a pillar shape is formed, a diffusion layer is formed in a lower portion of the silicon pillar, a gate material is then deposited, the gate material is then planarized and etched back, and an insulating film sidewall is formed on the side wall of the silicon pillar and the nitride film hard mask. Subsequently, a resist pattern for forming a gate line is formed, the gate material is etched, the nitride film hard mask is then removed, and a diffusion layer is formed in an upper portion of the silicon pillar (e.g., refer to Japanese Unexamined Patent Application Publication No. 2009-182317).

In such a method, when the distance between the silicon pillars is decreased, a thick gate material needs to be deposited between the silicon pillars and thus holes called voids may be formed between the silicon pillars. If voids are formed, holes are made in the gate material after the etching back. When an insulating film is then deposited to form an insulating film sidewall, the insulating film is deposited in the voids. This causes difficulty in gate material processing.

In view of the foregoing, it has been disclosed that a silicon pillar is formed, a gate oxide film is then formed, a thin polysilicon is deposited, a resist that covers an upper portion of the silicon pillar and is used to form a gate line is then formed, a gate line is etched, a thick oxide film is then deposited, the upper portion of the silicon pillar is caused to be exposed, the thin polysilicon on the upper portion of the silicon pillar is removed, and the thick oxide film is removed by wet etching (e.g., refer to B. Yang, K. D. Buddharaju, S. H. G. Teo, N. Singh, G. D. Lo, and D. L. Kwong, "Vertical Silicon-Nanowire Formation and Gate-All-Around MOSFET", IEEE Electron Device Letters, VOL. 29, No. 7, July 2008, pp 791-794).

However, a method in which a metal is used for gate electrodes is not described. In addition, a resist that covers an upper portion of the silicon pillar and is used to form a gate line needs to be formed. Therefore, the upper portion of the silicon pillar needs to be covered and thus such a method is not performed in a self-aligned process.

SUMMARY OF THE INVENTION

It is an object of the present invention to provide a method for producing an SGT in which a thin gate material is used, a metal gate is employed, and a self-aligned process is performed and an SGT structure obtained by the method.

A method for producing a semiconductor device according to a first aspect of the present invention includes:

a first step including forming a planar silicon layer on a silicon substrate, and forming a first pillar-shaped silicon layer and a second pillar-shaped silicon layer on the planar silicon layer;

a second step including, after the first step, forming a gate insulating film around each of the first pillar-shaped silicon layer and second pillar-shaped silicon layer, forming a metal film and a polysilicon film around the gate insulating film, the thickness of the polysilicon film being smaller than half of a distance between the first pillar-shaped silicon layer and the second pillar-shaped silicon layer, forming a third resist for forming a gate line, and forming the gate line by performing anisotropic etching; and a third step including, after the second step, depositing a fourth resist so that a portion of the polysilicon film on an upper side wall of each of the first pillar-shaped silicon layer and second pillar-shaped silicon layer is exposed, removing the exposed portion of the polysilicon film by etching, removing the fourth resist, and removing the metal film by etching to form a first gate electrode and a second gate electrode connected to the gate line.

In the method, upper portions of the first pillar-shaped silicon layer and second pillar-shaped silicon layer may be etched by the anisotropic etching.

In the method, an upper surface of the third resist for forming the gate line may be located at a lower position than an upper surface of the polysilicon film on each of the first pillar-shaped silicon layer and second pillar-shaped silicon layer.

The method may further include a fourth step including forming a first n-type diffusion layer in an upper portion of the first pillar-shaped silicon layer, forming a second n-type diffusion layer in a lower portion of the first pillar-shaped silicon layer and in an upper portion of the planar silicon layer, forming a first p-type diffusion layer in an upper portion of the second pillar-shaped silicon layer, and forming a second p-type diffusion layer in a lower portion of the second pillar-shaped silicon layer and in an upper portion of the planar silicon layer.

The method may further include a fifth step including forming silicides on the first n-type diffusion layer, the second n-type diffusion layer, the first p-type diffusion layer, the second p-type diffusion layer, and the gate line.

A semiconductor device according to a second aspect of the present invention includes:

a planar silicon layer formed on a silicon substrate;

first and second pillar-shaped silicon layers formed on the planar silicon layer;

a gate insulating film formed around the first pillar-shaped silicon layer;

a first gate electrode having a laminated structure of a metal film and a polysilicon film, both of which are formed around the gate insulating film;

a gate insulating film formed around the second pillar-shaped silicon layer;

a second gate electrode having a laminated structure of a metal film and a polysilicon film, both of which are formed around the gate insulating film;

the thickness of each of the polysilicon films being smaller than half of a distance between the first pillar-shaped silicon layer and the second pillar-shaped silicon layer;

a gate line connected to the first and second gate electrodes;

an upper surface of the gate line being located at a lower position than upper surfaces of the first and second gate electrodes;

a first n-type diffusion layer formed in an upper portion of the first pillar-shaped silicon layer;

a second n-type diffusion layer formed in a lower portion of the first pillar-shaped silicon layer and in an upper portion of the planar silicon layer;

a first p-type diffusion layer formed in an upper portion of the second pillar-shaped silicon layer; and a second p-type diffusion layer formed in a lower portion of the second pillar-shaped silicon layer and in an upper portion of the planar silicon layer.

In the semiconductor device, the gate line may have a laminated structure of the metal film and a silicide.

In the semiconductor device, the thickness of the insulating film sidewall formed on a side wall of the first n-type diffusion layer may be larger than the sum of the thicknesses of the metal film and polysilicon film.

In the semiconductor device, the center line of the gate line may be displaced from a line that connects a center point of the first pillar-shaped silicon layer to a center point of the second pillar-shaped silicon layer by a first predetermined distance.

The semiconductor device may further include silicides formed on the first and second n-type diffusion layers and the first and second p-type diffusion layers.

According to the present invention, there can be provided a method for producing an SGT in which a thin gate material is used, a metal gate is employed, and a self-aligned process is performed and an SGT structure obtained by the method.

The height of each of the first pillar-shaped silicon layer and second pillar-shaped silicon layer is set to be the sum of a desired height of the pillar-shaped silicon layer and the height of a portion removed by gate-line etching performed later, whereby a self-aligned process is achieved.

The method for producing an SGT includes:

a second step including forming a gate insulating film around each of the first pillar-shaped silicon layer and second pillar-shaped silicon layer, forming a metal film and a polysilicon film around the gate insulating film, the thickness of the polysilicon film being smaller than half of a distance between the first pillar-shaped silicon layer and the second pillar-shaped silicon layer, forming a third resist for forming a gate line, and forming the gate line by performing anisotropic etching; and a third step including, after the second step, depositing a fourth resist so that a portion of the polysilicon film on an upper side wall of each of the first pillar-shaped silicon layer and second pillar-shaped silicon layer is exposed, removing the exposed portion of the polysilicon film by etching, removing the fourth resist, and removing the metal film by etching to form a first gate electrode and a second gate electrode connected to the gate line.

Therefore, a self-aligned process is achieved.

Such a self-aligned process allows high degree of integration.

The gate line has a laminated structure of the metal film and a silicide. A direct contact between the silicide and the metal film can decrease the resistance.

The thickness of the insulating film sidewall formed on a side wall of the first n-type diffusion layer is larger than the sum of the thicknesses of the metal film and polysilicon film.

Even when a resist for forming contact holes is formed in a misaligned manner and contact holes are formed by overetching, a short circuit between a contact and the gate electrode can be prevented.

The center line of the gate line is displaced from a line that connects a center point of the first pillar-shaped silicon layer to a center point of the second pillar-shaped silicon layer by a first predetermined distance.

A silicide that connects the second n-type diffusion layer to the second p-type diffusion layer is easily formed, which can achieve high degree of integration.

BRIEF DESCRIPTION OF THE DRAWINGS

FIG. 1(A) is a plan view of a semiconductor device according to an embodiment of the present invention, FIG. 1(B) is a sectional view taken along line X-X' of FIG. 1(A), and FIG. 1(C) is a sectional view taken along line Y-Y' of FIG. 1(A);

FIG. 2(A) is a plan view showing a method for producing a semiconductor device according to this embodiment, FIG. 2(B) is a sectional view taken along line X-X' of FIG. 2(A), and FIG. 2(C) is a sectional view taken along line Y-Y' of FIG. 2(A);

FIG. 3(A) is a plan view showing a method for producing a semiconductor device according to this embodiment, FIG. 3(B) is a sectional view taken along line X-X' of FIG. 3(A), and FIG. 3(C) is a sectional view taken along line Y-Y' of FIG. 3(A);

FIG. 4(A) is a plan view showing a method for producing a semiconductor device according to this embodiment, FIG. 4(B) is a sectional view taken along line X-X' of FIG. 4(A), and FIG. 4(C) is a sectional view taken along line Y-Y' of FIG. 4(A);

FIG. 5(A) is a plan view showing a method for producing a semiconductor device according to this embodiment, FIG. 5(B) is a sectional view taken along line X-X' of FIG. 5(A), and FIG. 5(C) is a sectional view taken along line Y-Y' of FIG. 5(A);

FIG. 6(A) is a plan view showing a method for producing a semiconductor device according to this embodiment, FIG. 6(B) is a sectional view taken along line X-X' of FIG. 6(A), and FIG. 6(C) is a sectional view taken along line Y-Y' of FIG. 6(A);

FIG. 7(A) is a plan view showing a method for producing a semiconductor device according to this embodiment, FIG. 7(B) is a sectional view taken along line X-X' of FIG. 7(A), and FIG. 7(C) is a sectional view taken along line Y-Y' of FIG. 7(A);

FIG. 8(A) is a plan view showing a method for producing a semiconductor device according to this embodiment, FIG.

8(B) is a sectional view taken along line X-X' of FIG. 8(A), and FIG. 8(C) is a sectional view taken along line Y-Y' of FIG. 8(A);

FIG. 9(A) is a plan view showing a method for producing a semiconductor device according to this embodiment, FIG. 9(B) is a sectional view taken along line X-X' of FIG. 9(A), and FIG. 9(C) is a sectional view taken along line Y-Y' of FIG. 9(A);

FIG. 10(A) is a plan view showing a method for producing a semiconductor device according to this embodiment, FIG. 10(B) is a sectional view taken along line X-X' of FIG. 10(A), and FIG. 10(C) is a sectional view taken along line Y-Y' of FIG. 10(A);

FIG. 11(A) is a plan view showing a method for producing a semiconductor device according to this embodiment, FIG. 11(B) is a sectional view taken along line X-X' of FIG. 11(A), and FIG. 11(C) is a sectional view taken along line Y-Y' of FIG. 11(A);

FIG. 12(A) is a plan view showing a method for producing a semiconductor device according to this embodiment, FIG. 12(B) is a sectional view taken along line X-X' of FIG. 12(A), and FIG. 12(C) is a sectional view taken along line Y-Y' of FIG. 12(A);

FIG. 13(A) is a plan view showing a method for producing a semiconductor device according to this embodiment, FIG. 13(B) is a sectional view taken along line X-X' of FIG. 13(A), and FIG. 13(C) is a sectional view taken along line Y-Y' of FIG. 13(A);

FIG. 14(A) is a plan view showing a method for producing a semiconductor device according to this embodiment, FIG. 14(B) is a sectional view taken along line X-X' of FIG. 14(A), and FIG. 14(C) is a sectional view taken along line Y-Y' of FIG. 14(A);

FIG. 15(A) is a plan view showing a method for producing a semiconductor device according to this embodiment, FIG. 15(B) is a sectional view taken along line X-X' of FIG. 15(A), and FIG. 15(C) is a sectional view taken along line Y-Y' of FIG. 15(A);

FIG. 16(A) is a plan view showing a method for producing a semiconductor device according to this embodiment, FIG. 16(B) is a sectional view taken along line X-X' of FIG. 16(A), and FIG. 16(C) is a sectional view taken along line Y-Y' of FIG. 16(A);

FIG. 17(A) is a plan view showing a method for producing a semiconductor device according to this embodiment, FIG. 17(B) is a sectional view taken along line X-X' of FIG. 17(A), and FIG. 17(C) is a sectional view taken along line Y-Y' of FIG. 17(A);

FIG. 18(A) is a plan view showing a method for producing a semiconductor device according to this embodiment, FIG. 18(B) is a sectional view taken along line X-X' of FIG. 18(A), and FIG. 18(C) is a sectional view taken along line Y-Y' of FIG. 18(A);

FIG. 19(A) is a plan view showing a method for producing a semiconductor device according to this embodiment, FIG. 19(B) is a sectional view taken along line X-X' of FIG. 19(A), and FIG. 19(C) is a sectional view taken along line Y-Y' of FIG. 19(A);

FIG. 20(A) is a plan view showing a method for producing a semiconductor device according to this embodiment, FIG. 20(B) is a sectional view taken along line X-X' of FIG. 20(A), and FIG. 20(C) is a sectional view taken along line Y-Y' of FIG. 20(A);

FIG. 21(A) is a plan view showing a method for producing a semiconductor device according to this embodiment, FIG. 21(B) is a sectional view taken along line X-X' of FIG. 21(A), and FIG. 21(C) is a sectional view taken along line Y-Y' of FIG. 21(A);

FIG. 22(A) is a plan view showing a method for producing a semiconductor device according to this embodiment, FIG. 22(B) is a sectional view taken along line X-X' of FIG. 22(A), and FIG. 22(C) is a sectional view taken along line Y-Y' of FIG. 22(A);

FIG. 23(A) is a plan view showing a method for producing a semiconductor device according to this embodiment, FIG. 23(B) is a sectional view taken along line X-X' of FIG. 23(A), and FIG. 23(C) is a sectional view taken along line Y-Y' of FIG. 23(A);

FIG. 24(A) is a plan view showing a method for producing a semiconductor device according to this embodiment, FIG. 24(B) is a sectional view taken along line X-X' of FIG. 24(A), and FIG. 24(C) is a sectional view taken along line Y-Y' of FIG. 24(A);

FIG. 25(A) is a plan view showing a method for producing a semiconductor device according to this embodiment, FIG. 25(B) is a sectional view taken along line X-X' of FIG. 25(A), and FIG. 25(C) is a sectional view taken along line Y-Y' of FIG. 25(A);

FIG. 26(A) is a plan view showing a method for producing a semiconductor device according to this embodiment, FIG. 26(B) is a sectional view taken along line X-X' of FIG. 26(A), and FIG. 26(C) is a sectional view taken along line Y-Y' of FIG. 26(A);

FIG. 27(A) is a plan view showing a method for producing a semiconductor device according to this embodiment, FIG. 27(B) is a sectional view taken along line X-X' of FIG. 27(A), and FIG. 27(C) is a sectional view taken along line Y-Y' of FIG. 27(A);

FIG. 28(A) is a plan view showing a method for producing a semiconductor device according to this embodiment, FIG. 28(B) is a sectional view taken along line X-X' of FIG. 28(A), and FIG. 28(C) is a sectional view taken along line Y-Y' of FIG. 28(A);

FIG. 29(A) is a plan view showing a method for producing a semiconductor device according to this embodiment, FIG. 29(B) is a sectional view taken along line X-X' of FIG. 29(A), and FIG. 29(C) is a sectional view taken along line Y-Y' of FIG. 29(A);

FIG. 30(A) is a plan view showing a method for producing a semiconductor device according to this embodiment, FIG. 30(B) is a sectional view taken along line X-X' of FIG. 30(A), and FIG. 30(C) is a sectional view taken along line Y-Y' of FIG. 30(A);

FIG. 31(A) is a plan view showing a method for producing a semiconductor device according to this embodiment, FIG. 31(B) is a sectional view taken along line X-X' of FIG. 31(A), and FIG. 31(C) is a sectional view taken along line Y-Y' of FIG. 31(A);

FIG. 32(A) is a plan view showing a method for producing a semiconductor device according to this embodiment, FIG. 32(B) is a sectional view taken along line X-X' of FIG. 32(A), and FIG. 32(C) is a sectional view taken along line Y-Y' of FIG. 32(A);

FIG. 33(A) is a plan view showing a method for producing a semiconductor device according to this embodiment, FIG. 33(B) is a sectional view taken along line X-X' of FIG. 33(A), and FIG. 33(C) is a sectional view taken along line Y-Y' of FIG. 33(A);

FIG. 34(A) is a plan view showing a method for producing a semiconductor device according to this embodiment, FIG.

34(B) is a sectional view taken along line X-X' of FIG. 34(A), and FIG. 34(C) is a sectional view taken along line Y-Y' of FIG. 34(A);

FIG. 35(A) is a plan view showing a method for producing a semiconductor device according to this embodiment, FIG. 35(B) is a sectional view taken along line X-X' of FIG. 35(A), and FIG. 35(C) is a sectional view taken along line Y-Y' of FIG. 35(A);

FIG. 36(A) is a plan view showing a method for producing a semiconductor device according to this embodiment, FIG. 36(B) is a sectional view taken along line X-X' of FIG. 36(A), and FIG. 36(C) is a sectional view taken along line Y-Y' of FIG. 36(A);

FIG. 37(A) is a plan view showing a method for producing a semiconductor device according to this embodiment, FIG. 37(B) is a sectional view taken along line X-X' of FIG. 37(A), and FIG. 37(C) is a sectional view taken along line Y-Y' of FIG. 37(A);

FIG. 38(A) is a plan view showing a method for producing a semiconductor device according to this embodiment, FIG. 38(B) is a sectional view taken along line X-X' of FIG. 38(A), and FIG. 38(C) is a sectional view taken along line Y-Y' of FIG. 38(A);

FIG. 39(A) is a plan view showing a method for producing a semiconductor device according to this embodiment, FIG. 39(B) is a sectional view taken along line X-X' of FIG. 39(A), and FIG. 39(C) is a sectional view taken along line Y-Y' of FIG. 39(A); and FIG. 40(A) is a plan view showing a method for producing a semiconductor device according to this embodiment, FIG. 40(B) is a sectional view taken along line X-X' of FIG. 40(A), and FIG. 40(C) is a sectional view taken along line Y-Y' of FIG. 40(A).

DESCRIPTION OF THE PREFERRED EMBODIMENTS

A production process of a semiconductor device having an SGT structure according to an embodiment of the present invention will now be described with reference to FIGS. 2 to 40.

A first step will now be described. The first step includes forming a planar silicon layer 107 on a silicon substrate 101 and forming a first pillar-shaped silicon layer 104 and a second pillar-shaped silicon layer 105 on the planar silicon layer 107.

First, as shown in FIG. 2, first resists 102 and 103 for respectively forming a first pillar-shaped silicon layer 104 and a second pillar-shaped silicon layer 105 are formed on a silicon substrate 101.

Next, as shown in FIG. 3, the silicon substrate 101 is etched to form a first pillar-shaped silicon layer 104 and a second pillar-shaped silicon layer 105. The height of each of the first pillar-shaped silicon layer 104 and second pillar-shaped silicon layer 105 is desirably the sum of a desired height of the pillar-shaped silicon layer and the height of a portion removed by gate-line etching performed later.

Next, as shown in FIG. 4, the first resists 102 and 103 are removed.

Next, as shown in FIG. 5, a second resist 106 for forming a planar silicon layer 107 is formed.

Next, as shown in FIG. 6, the silicon substrate 101 is etched to form a planar silicon layer 107.

Next, as shown in FIG. 7, the second resist 106 is removed.

Next, as shown in FIG. 8, an element separation film 108 is formed around the planar silicon layer 107.

The first step has been described, the first step including forming a planar silicon layer 107 on a silicon substrate 101 and forming a first pillar-shaped silicon layer 104 and a second pillar-shaped silicon layer 105 on the planar silicon layer 107.

A second step will now be described. The second step includes forming a gate insulating film 109 around each of the first pillar-shaped silicon layer 104 and second pillar-shaped silicon layer 105, forming a metal film 110 and a polysilicon film 111 around the gate insulating film 109, the thickness of the polysilicon film 111 being smaller than half of a distance between the first pillar-shaped silicon layer 104 and the second pillar-shaped silicon layer 105, forming a third resist 112 for forming a gate line 114c, and forming the gate line 114c by performing anisotropic etching.

As shown in FIG. 9, a gate insulating film 109 is formed around each of the first pillar-shaped silicon layer 104 and second pillar-shaped silicon layer 105.

A metal film 110 and a polysilicon film 111 are formed around the gate insulating film 109. Herein, a thin polysilicon film is used so that voids can be prevented from being formed in the polysilicon film.

The metal film 110 may be composed of any metal, such as titanium nitride, that is used in a semiconductor process and sets the threshold voltage of a transistor.

The gate insulating film 109 may be any film used in a semiconductor process, such as an oxide film, an oxynitride film, or a high-dielectric film.

Next, as shown in FIG. 10, a third resist 112 for forming a gate line 114c is formed. In this embodiment, the description is made so that the height of the resist is smaller than that of each of the pillar-shaped silicon layers. This may be because, when the height of each of the pillar-shaped silicon layers is large, the thickness of a resist on an upper portion of the pillar-shaped silicon layer is decreased or the polysilicon film on an upper portion of the pillar-shaped silicon layer is exposed. As the width of the gate line decreases, the polysilicon film on the upper portion of the pillar-shaped silicon layer tends to be exposed.

The height of the resist may be larger than that of each of the pillar-shaped silicon layers.

Furthermore, the third resist 112 is preferably formed so that the center line of the third resist 112 for forming the gate line is displaced from a line that connects the center point of the first pillar-shaped silicon layer 104 to the center point of the second pillar-shaped silicon layer 105. This is because a silicide that connects a second n-type diffusion layer 118 to a second p-type diffusion layer 121 is easily formed.

Next, as shown in FIG. 11, the polysilicon film 111 and the metal film 110 are etched.

As a result, a polysilicon film 111a, a polysilicon film 111b, and a polysilicon film wiring 111c are formed. Herein, if the thickness of the resist on the upper portion of each of the pillar-shaped silicon layers is small or the polysilicon film on the upper portion of each of the pillar-shaped silicon layers is exposed, the upper portion of each of the pillar-shaped silicon layers may be etched during the etching. In such a case, when each of the pillar-shaped silicon layers is formed, the height of the pillar-shaped silicon layer may be set to be the sum of a desired height of the pillar-shaped silicon layer and the height of a portion removed by gate-line etching performed later. Therefore, the production process of the present invention is a self-aligned process.

Since the metal film 110 is etched later, only the polysilicon film 111 may be etched in this process.

Next, as shown in FIG. 12, the third resist 112 is removed.

The second step has been described, the second step including forming a gate insulating film 109 around each of the first pillar-shaped silicon layer 104 and second pillar-shaped silicon layer 105, forming a metal film 110 and a polysilicon film 111 around the gate insulating film 109, the thickness of the polysilicon film 111 being smaller than half of a distance between the first pillar-shaped silicon layer 104 and the second pillar-shaped silicon layer 105, forming a third resist 112 for forming a gate line 114c, and forming the gate line 114c by performing anisotropic etching.

A third step will now be described. The third step includes depositing a fourth resist 113 so that portions of the polysilicon films 111b and 111a on upper side walls of the first pillar-shaped silicon layer 104 and second pillar-shaped silicon layer 105 are exposed, removing the exposed portions of the polysilicon films 111a and 111b by etching, removing the fourth resist 113, and removing the metal film 110 by etching to form a first gate electrode 114b and a second gate electrode 114a connected to the gate line 114c.

As shown in FIG. 13, a fourth resist 113 is deposited so that portions of the polysilicon films 111b and 111a on upper side walls of the first pillar-shaped silicon layer 104 and second pillar-shaped silicon layer 105 are exposed. This is preferably performed by resist etch back. A coating film such as a spin-on-glass film may also be used.

Next, as shown in FIG. 14, the exposed portions of the polysilicon films 111a and 111b are removed by etching. This is preferably performed by isotropic dry etching.

Next, as shown in FIG. 15, the fourth resist 113 is removed.

Next, as shown in FIG. 16, the metal film 110 is removed by etching to form a metal film 110b on a side wall of the first pillar-shaped silicon layer 104, a metal film 110a on a side wall of the second pillar-shaped silicon layer 105, and a metal film 110c below the polysilicon film wiring 111c. This is preferably performed by isotropic etching.

The metal film 110b and the polysilicon film 111b constitute a first gate electrode 114b.

The metal film 110a and the polysilicon film 111a constitute a second gate electrode 114a.

The metal film 110c and the polysilicon film wiring 111c constitute a gate line 114c. Therefore, this process is a self-aligned process.

The third step has been described, the third step including depositing a fourth resist 113 so that portions of the polysilicon films 111b and 111a on upper side walls of the first pillar-shaped silicon layer 104 and second pillar-shaped silicon layer 105 are exposed, removing the exposed portions of the polysilicon films 111a and 111b by etching, removing the fourth resist 113, and removing the metal film 110 by etching to form a first gate electrode 114b and a second gate electrode 114a connected to the gate line 114c.

A fourth step will now be described. The fourth step includes forming a first n-type diffusion layer 117 in an upper portion of the first pillar-shaped silicon layer 104, forming a second n-type diffusion layer 118 in a lower portion of the first pillar-shaped silicon layer 104 and in an upper portion of the planar silicon layer 107, forming a first p-type diffusion layer 120 in an upper portion of the second pillar-shaped silicon layer 105, and forming a second p-type diffusion layer 121 in a lower portion of the second pillar-shaped silicon layer 105 and in an upper portion of the planar silicon layer 107.

As shown in FIG. 17, an oxide film 115 is deposited.

Next, as shown in FIG. 18, a fifth resist 116 for forming a first n-type diffusion layer 117 and a second n-type diffusion layer 118 is formed.

Next, as shown in FIG. 19, arsenic is implanted to form a first n-type diffusion layer 117 and a second n-type diffusion layer 118.

Next, as shown in FIG. 20, the fifth resist 116 is removed.

Next, as shown in FIG. 21, a sixth resist 119 for forming a first p-type diffusion layer 120 and a second p-type diffusion layer 121 is formed.

Next, as shown in FIG. 22, boron or boron fluoride is implanted to form a first p-type diffusion layer 120 and a second p-type diffusion layer 121.

Next, as shown in FIG. 23, the sixth resist 119 is removed.

Next, as shown in FIG. 24, a nitride film 122 is deposited and a heat treatment is performed.

The fourth step has been described, the fourth step including forming a first n-type diffusion layer 117 in an upper portion of the first pillar-shaped silicon layer 104, forming a second n-type diffusion layer 118 in a lower portion of the first pillar-shaped silicon layer 104 and in an upper portion of the planar silicon layer 107, forming a first p-type diffusion layer 120 in an upper portion of the second pillar-shaped silicon layer 105, and forming a second p-type diffusion layer 121 in a lower portion of the second pillar-shaped silicon layer 105 and in an upper portion of the planar silicon layer 107.

A fifth step will now be described. The fifth step includes forming silicides on the first n-type diffusion layer 117, the second n-type diffusion layer 118, the first p-type diffusion layer 120, the second p-type diffusion layer 121, and the gate line 114c.

As shown in FIG. 25, the nitride film 122 is etched to form nitride film sidewalls 123, 124, and 125.

Next, as shown in FIG. 26, the oxide film is etched to form oxide film sidewalls 127, 126, and 128. The nitride film sidewall 123 and the oxide film sidewall 127 constitute an insulating film sidewall 129. The nitride film sidewall 124 and the oxide film sidewall 126 constitute an insulating film sidewall 130. The nitride film sidewall 125 and the oxide film sidewall 128 on a side wall of the first pillar-shaped silicon layer 104 constitute an insulating film sidewall 131. The nitride film sidewall 125 and the oxide film sidewall 128 on a side wall of the second pillar-shaped silicon layer 105 constitute an insulating film sidewall 132.

Herein, the thickness of the insulating film sidewall 129 formed on a side wall of the first n-type diffusion layer 117 is preferably larger than the sum of the thicknesses of the metal film 110b and polysilicon film 111b.

When the thickness of the insulating film sidewall 129 formed on a side wall of the first n-type diffusion layer 117 is larger than the sum of the thicknesses of the metal film 110b and polysilicon film 111b, a contact and the gate electrode 114b are easily insulated from each other during the formation of the contact.

Next, as shown in FIG. 27, a metal is deposited, a heat treatment is performed, and an unreacted metal is removed to form silicides 134, 138, 136, 137, 133, and 135 on the first n-type diffusion layer 117, the second n-type diffusion layer 118, the first p-type diffusion layer 120, the second p-type diffusion layer 121, and the gate line 114c.

The second n-type diffusion layer 118 and the second p-type diffusion layer 121 are connected to each other through the silicide 138. Since the center line of the gate line 114c is displaced from a line that connects the center point of the first pillar-shaped silicon layer 104 to the center point of the second pillar-shaped silicon layer 105, the silicide 138 is easily formed. Therefore, high degree of integration can be achieved.

Since the polysilicon film wiring 111*c* is thin, the gate line 114*c* tends to have a laminated structure of the metal film 110*c* and the silicide 133. The silicide 133 and the metal film 110*c* are in direct contact with each other and thus the resistance can be decreased.

The fifth step has been described, the fifth step including forming silicides on the first n-type diffusion layer 117, the second n-type diffusion layer 118, the first p-type diffusion layer 120, the second p-type diffusion layer 121, and the gate line 114*c*.

Next, as shown in FIG. 28, a contact stopper 139 such as a nitride film is formed and an interlayer insulating film 140 is formed.

Next, as shown in FIG. 29, a seventh resist 141 for forming contact holes 142 and 143 is formed.

Next, as shown in FIG. 30, the interlayer insulating film 140 is etched to form contact holes 142 and 143. In the case where the thickness of the insulating film sidewall 129 formed on a side wall of the first n-type diffusion layer 117 is larger than the sum of the thicknesses of the metal film 110*b* and polysilicon film 111*b*, even if the seventh resist is formed in a misaligned manner and the contact holes are formed by overetching, a short circuit between the contact and the gate electrode 114*b* can be prevented.

Next, as shown in FIG. 31, the seventh resist 141 is removed.

Next, as shown in FIG. 32, an eighth resist 144 for forming contact holes 145 and 146 is formed.

Next, as shown in FIG. 33, the interlayer insulating film 140 is etched to form contact holes 145 and 146.

Next, as shown in FIG. 34, the eighth resist 144 is removed.

Next, as shown in FIG. 35, portions of the contact stopper 139 below the contact holes 142 and 143 and the contact holes 145 and 146 are removed by etching.

Next, as shown in FIG. 36, a metal is deposited to form contacts 147, 148, 149, and 150.

Next, as shown in FIG. 37, a metal 151 for metal wirings is deposited.

Next, as shown in FIG. 38, ninth resists 152, 153, 154, and 155 for forming metal wirings are formed.

Next, as shown in FIG. 39, the metal 151 is etched to form metal wirings 156, 157, 158, and 159.

Next, as shown in FIG. 40, the ninth resists 152, 153, 154, and 155 are removed.

The method for producing an SGT in which a thin gate material is used, a metal gate is employed, and a self-aligned process is performed has been described.

FIG. 1 shows the structure of a semiconductor device produced by the above production method.

As shown in FIG. 1, the semiconductor device includes:

a planar silicon layer 107 formed on a silicon substrate 101;

first and second pillar-shaped silicon layers 104 and 105 formed on the planar silicon layer 107;

a gate insulating film 109 formed around the first pillar-shaped silicon layer 104;

a first gate electrode 114*b* having a laminated structure of a metal film 110*b* and a polysilicon film 111*b*, both of which are formed around the gate insulating film 109;

a gate insulating film 109 formed around the second pillar-shaped silicon layer 105;

a second gate electrode 114*a* having a laminated structure of a metal film 110*a* and a polysilicon film 111*a*, both of which are formed around the gate insulating film 109 formed around the second pillar-shaped silicon layer 105;

the thickness of the polysilicon films 111*b* and 111*a* being smaller than half of a distance between the first pillar-shaped silicon layer 104 and the second pillar-shaped silicon layer 105;

a gate line 114*c* connected to the first gate electrode 114*b* and second gate electrode 114*a*;

an upper surface of the gate line 114*c* being located at a lower position than those of the first and second gate electrodes 114*b* and 114*a*;

a first n-type diffusion layer 117 formed in an upper portion of the first pillar-shaped silicon layer 104;

a second n-type diffusion layer 118 formed in a lower portion of the first pillar-shaped silicon layer 104 and in an upper portion of the planar silicon layer 107;

a first p-type diffusion layer 120 formed in an upper portion of the second pillar-shaped silicon layer 105; and a second p-type diffusion layer 121 formed in a lower portion of the second pillar-shaped silicon layer 105 and in an upper portion of the planar silicon layer 107.

The gate line 114*c* has a laminated structure of the metal film 110*c* and the silicide 133. The silicide 133 and the metal film 110*c* are in direct contact with each other and thus the resistance can be decreased.

The thickness of the insulating film sidewall 129 formed on a side wall of the first n-type diffusion layer 117 is larger than the sum of the thicknesses of the metal film 110*b* and polysilicon film 111*b*.

Even if the seventh resist is formed in a misaligned manner and the contact holes are formed by overetching, a short circuit between the contact 148 and the gate electrode 114*b* can be prevented.

The center line of the gate line 114*c* is displaced from a line that connects the center point of the first pillar-shaped silicon layer 104 to the center point of the second pillar-shaped silicon layer 105 by a first predetermined distance.

The silicide 138 that connects the second n-type diffusion layer 118 to the second p-type diffusion layer 121 is easily formed. Therefore, high degree of integration can be achieved.

In the present invention, various embodiments and modifications can be made without departing from the broad sprit and scope of the present invention. Furthermore, the above-described embodiment is provided to describe one embodiment of the present invention, and the scope of the present invention is not limited thereto.

For example, a method for producing a semiconductor device in which the p-type (including the p⁺-type) and the n-type (including the n⁺-type) are each changed to the opposite conductivity type in the above embodiment, and a semiconductor device produced by the method are also obviously included in the technical scope of the present invention.

What is claimed is:

1. A method of producing a semiconductor device, the method which comprises the following:

a first step including forming a planar silicon layer on a silicon substrate, and forming a first pillar-shaped silicon layer and a second pillar-shaped silicon layer on the planar silicon layer;

a second step, subsequent to the first step, including forming a gate insulating film around each of the first pillar-shaped silicon layer and second pillar-shaped silicon layer, forming a metal film and a polysilicon film around the gate insulating film, wherein a thickness of the polysilicon film is smaller than half a distance between the first pillar-shaped silicon layer and the second pillar-shaped silicon layer, forming a resist, and after forming the resist, forming a gate line by performing anisotropic etching of at least the polysilicon film, and subsequent to performing the anisotropic etching, removing the resist; and a third step, subsequent to the second step, including depositing a further resist so that a portion of the polysilicon film on an upper side wall of each of the first pillar-shaped silicon layer and second pillar-shaped silicon layer is exposed, removing the exposed portion of the polysilicon film by etching, removing the further resist, and removing the metal film by etching to form a first gate electrode and a second gate electrode, wherein the first gate electrode and the second gate electrode are connected to the gate line.

2. The method for producing a semiconductor device according to claim 1, which comprises etching upper portions of the first pillar-shaped silicon layer and second pillar-shaped silicon layer by the anisotropic etching.

3. The method for producing a semiconductor device according to claim 1, wherein an upper surface of the resist for forming the gate line is located at a lower position than an upper surface of the polysilicon film on each of the first pillar-shaped silicon layer and second pillar-shaped silicon layer.

4. The method for producing a semiconductor device according to claim 1, further comprising a fourth step including forming a first n-type diffusion layer in an upper portion of the first pillar-shaped silicon layer, forming a second n-type diffusion layer in a lower portion of the first pillar-shaped silicon layer and in an upper portion of the planar silicon layer, forming a first p-type diffusion layer in an upper portion of the second pillar-shaped silicon layer, and forming a second p-type diffusion layer in a lower portion of the second pillar-shaped silicon layer and in an upper portion of the planar silicon layer.

5. The method for producing a semiconductor device according to claim 4, further comprising a fifth step including forming silicides on the first n-type diffusion layer, the second n-type diffusion layer, the first p-type diffusion layer, the second p-type diffusion layer, and the gate line.

6. A semiconductor device, comprising:

a planar silicon layer formed on a silicon substrate;

first and second pillar-shaped silicon layers formed on the planar silicon layer;

a gate insulating film formed around the first pillar-shaped silicon layer;

a first gate electrode having a laminated structure of a metal film and a polysilicon film, both of which are formed around the gate insulating film;

a gate insulating film formed around the second pillar-shaped silicon layer;

a second gate electrode having a laminated structure of a metal film and a polysilicon film, both of which are formed around the gate insulating film;

the thickness of each of the polysilicon films being smaller than half of a distance between the first pillar-shaped silicon layer and the second pillar-shaped silicon layer;

a gate line connected to the first and second gate electrodes;

an upper surface of the gate line being located at a lower position than upper surfaces of the first and second gate electrodes;

a first n-type diffusion layer formed in an upper portion of the first pillar-shaped silicon layer;

a second n-type diffusion layer formed in a lower portion of the first pillar-shaped silicon layer and in an upper portion of the planar silicon layer;

a first p-type diffusion layer formed in an upper portion of the second pillar-shaped silicon layer; and a second p-type diffusion layer formed in a lower portion of the second pillar-shaped silicon layer and in an upper portion of the planar silicon layer.

7. The semiconductor device according to claim 6, wherein the gate line has a laminated structure of the metal film and a silicide.

8. The semiconductor device according to claim 6, wherein the thickness of the insulating film sidewall formed on a side wall of the first n-type diffusion layer is larger than the sum of the thicknesses of the metal film and polysilicon film.

9. The semiconductor device according to claim 6, wherein the center line of the gate line is displaced from a line that connects a center point of the first pillar-shaped silicon layer to a center point of the second pillar-shaped silicon layer by a first predetermined distance.

10. The semiconductor device according to claim 9, further comprising silicides formed on the first and second n-type diffusion layers and the first and second p-type diffusion layers.

11. The method for producing a semiconductor device according to claim 1, wherein the step of forming the gate line by performing anisotropic etching includes also removing portions of the metal film that are not protected by the resist.

* * * * *